(12) United States Patent
Ching et al.

(10) Patent No.: US 10,720,503 B2
(45) Date of Patent: Jul. 21, 2020

(54) METHOD FOR MANUFACTURING SEMICONDUCTOR DEVICE

(71) Applicant: TAIWAN SEMICONDUCTOR MANUFACTURING CO., LTD., Hsinchu (TW)

(72) Inventors: Kuo-Cheng Ching, Hsinchu County (TW); Shi-Ning Ju, Hsinchu (TW); Kuan-Lun Cheng, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/103,704

(22) Filed: Aug. 14, 2018

(65) Prior Publication Data

US 2020/0058556 A1 Feb. 20, 2020

(51) Int. Cl.
| | | |
|---|---|---|
| *H01L 29/423* | (2006.01) | |
| *H01L 21/8234* | (2006.01) | |
| *H01L 27/088* | (2006.01) | |
| *H01L 29/78* | (2006.01) | |
| *H01L 29/06* | (2006.01) | |

(52) U.S. Cl.
CPC ......... *H01L 29/42392* (2013.01); *H01L 21/823412* (2013.01); *H01L 21/823431* (2013.01); *H01L 27/0886* (2013.01); *H01L 29/7854* (2013.01); *H01L 29/0673* (2013.01); *H01L 29/7853* (2013.01)

(58) Field of Classification Search
CPC ..... H01L 21/823431; H01L 21/823412; H01L 27/0886; H01L 29/0673; H01L 29/42392; H01L 29/7853; H01L 29/7854
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |

(Continued)

OTHER PUBLICATIONS

U.S. Appl. No. 15/794,286, filed Oct. 26, 2017.
U.S. Office Action dated Jan. 8, 2020 issued in copending U.S. Appl. No. 16/681,621.

*Primary Examiner* — Feifei Yeung Lopez
(74) *Attorney, Agent, or Firm* — Birch, Stewart, Kolasch & Birch, LLP

(57) ABSTRACT

A semiconductor device includes a semiconductor substrate, a first fin structure and a second fin structure. The first fin structure includes a first fin and at least two first nano wires disposed above the first fin, and the first fin protrudes from the semiconductor substrate. The second fin structure includes a second fin and at least two second nano wires disposed above the second fin, and the second fin protrudes from the semiconductor substrate. Each first nano wire has a first width different from a second width of each second nano wire.

20 Claims, 24 Drawing Sheets

(56) References Cited

U.S. PATENT DOCUMENTS

| | | |
|---|---|---|
| 9,608,116 B2 | 3/2017 | Ching et al. |
| 9,660,033 B1 * | 5/2017 | Chen ............... H01L 29/1054 |
| 10,056,289 B1 | 8/2018 | Cheng et al. |
| 10,074,732 B1 | 9/2018 | Dou et al. |
| 10,103,238 B1 | 10/2018 | Zang et al. |
| 2006/0049429 A1 * | 3/2006 | Kim ............... H01L 29/42384 257/213 |
| 2011/0278539 A1 * | 11/2011 | Bangsaruntip ......... B82Y 10/00 257/14 |
| 2015/0053912 A1 * | 2/2015 | Ching ............... H01L 29/0673 257/9 |
| 2017/0271474 A1 * | 9/2017 | Obradovic ............ H01L 27/088 |
| 2018/0156749 A1 * | 6/2018 | Rozeau ............... B82Y 10/00 |
| 2019/0221483 A1 | 7/2019 | Mulfinger et al. |
| 2020/0006478 A1 * | 1/2020 | Hsu ............... H01L 29/66545 |

\* cited by examiner

METHOD FOR MANUFACTURING SEMICONDUCTOR DEVICE

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
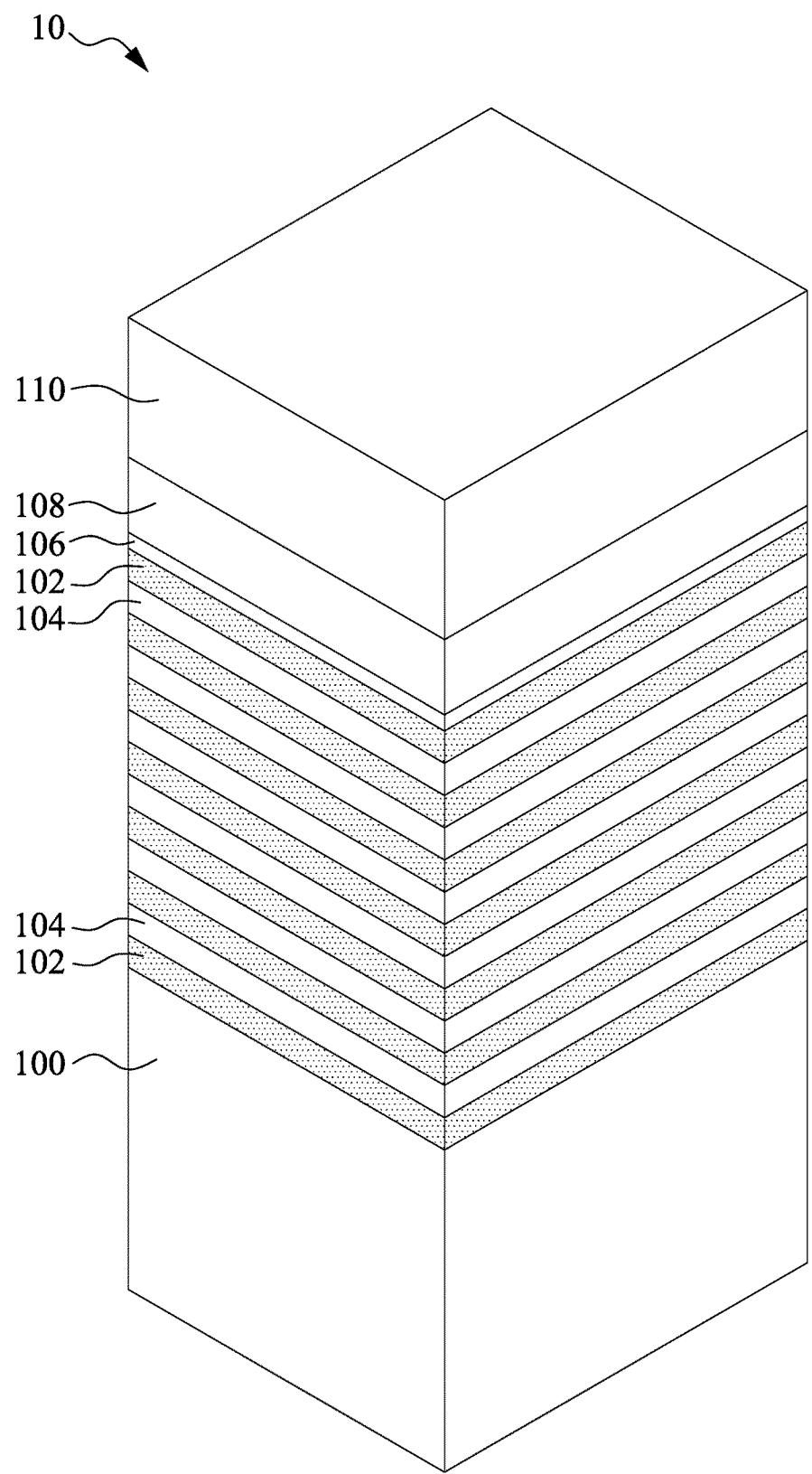
FIGS. 1-8B and 10A-12B are perspective views of a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 12A:
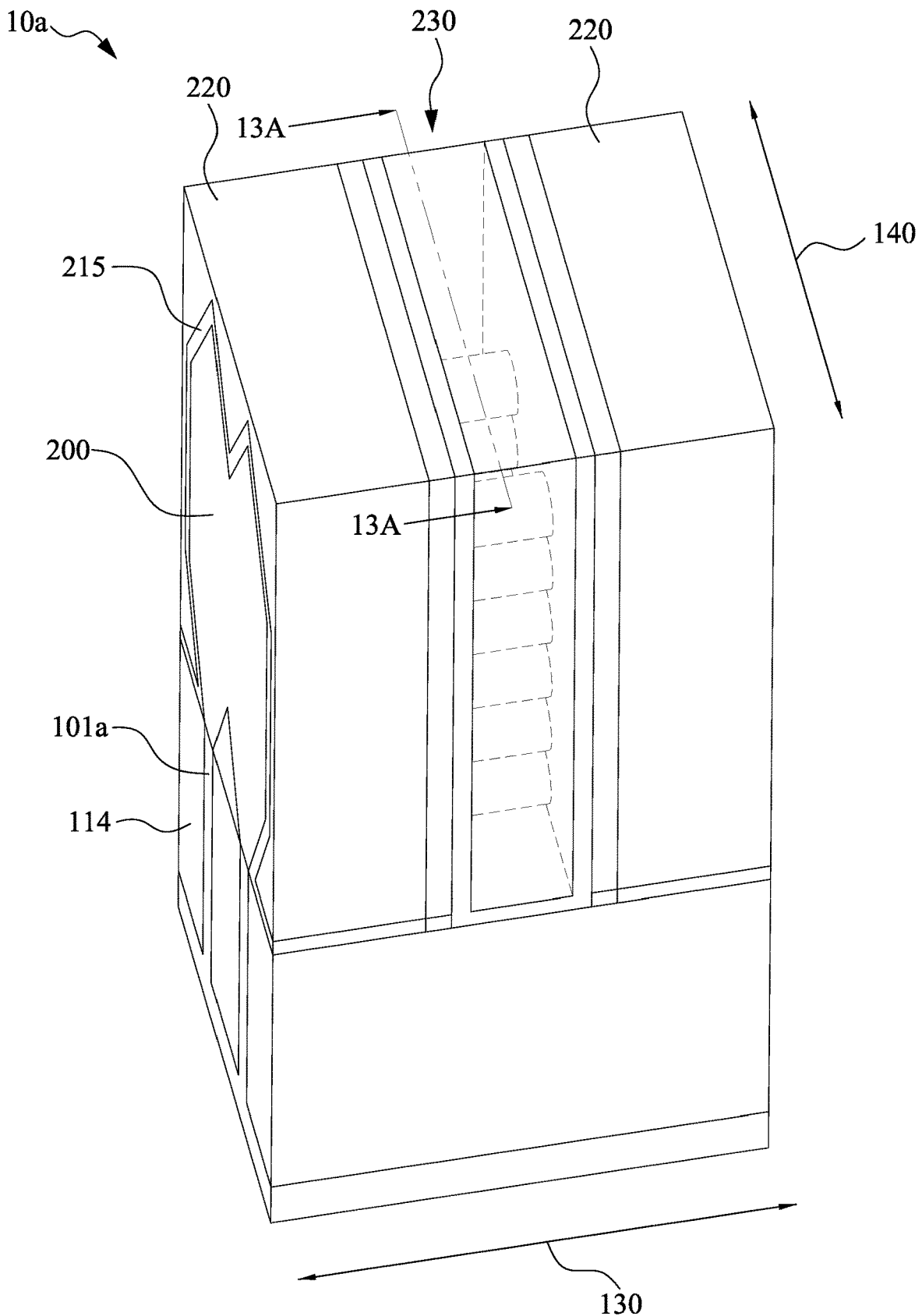
Figure 12B:
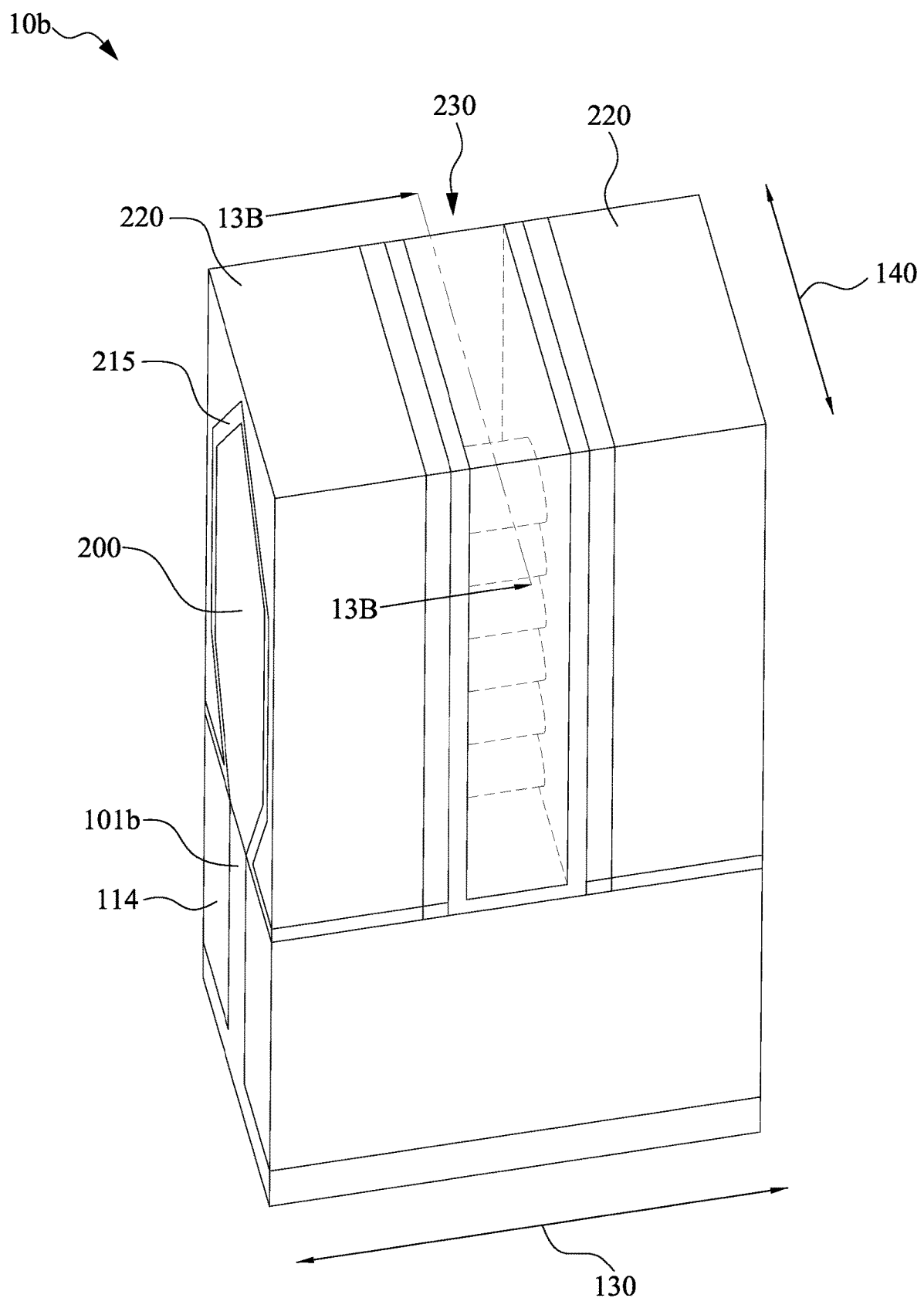
Figure 13A:
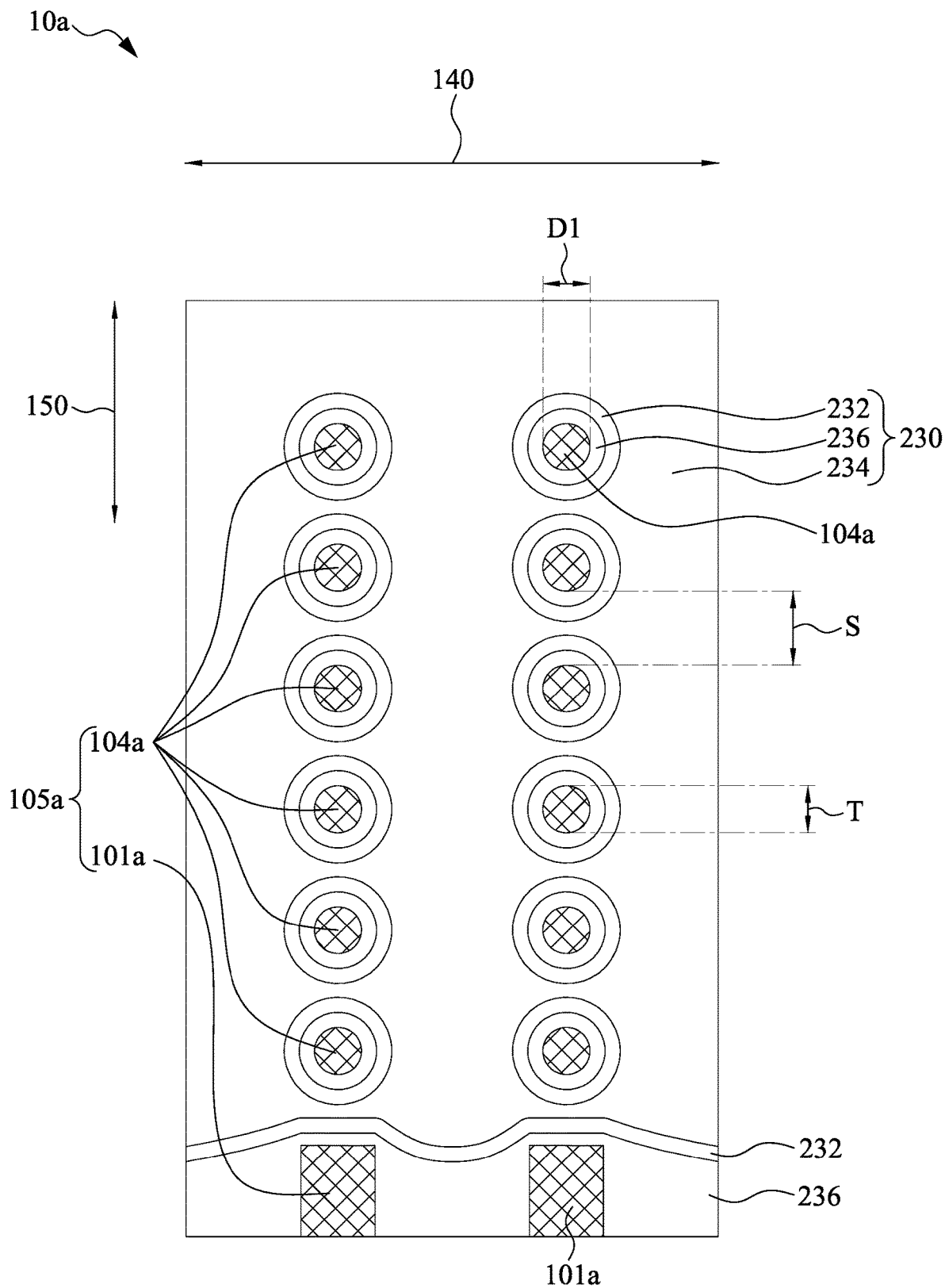
FIG. 13A is a cross-sectional view taken along a cross-sectional line of FIG. 12A.
Figure 13B:
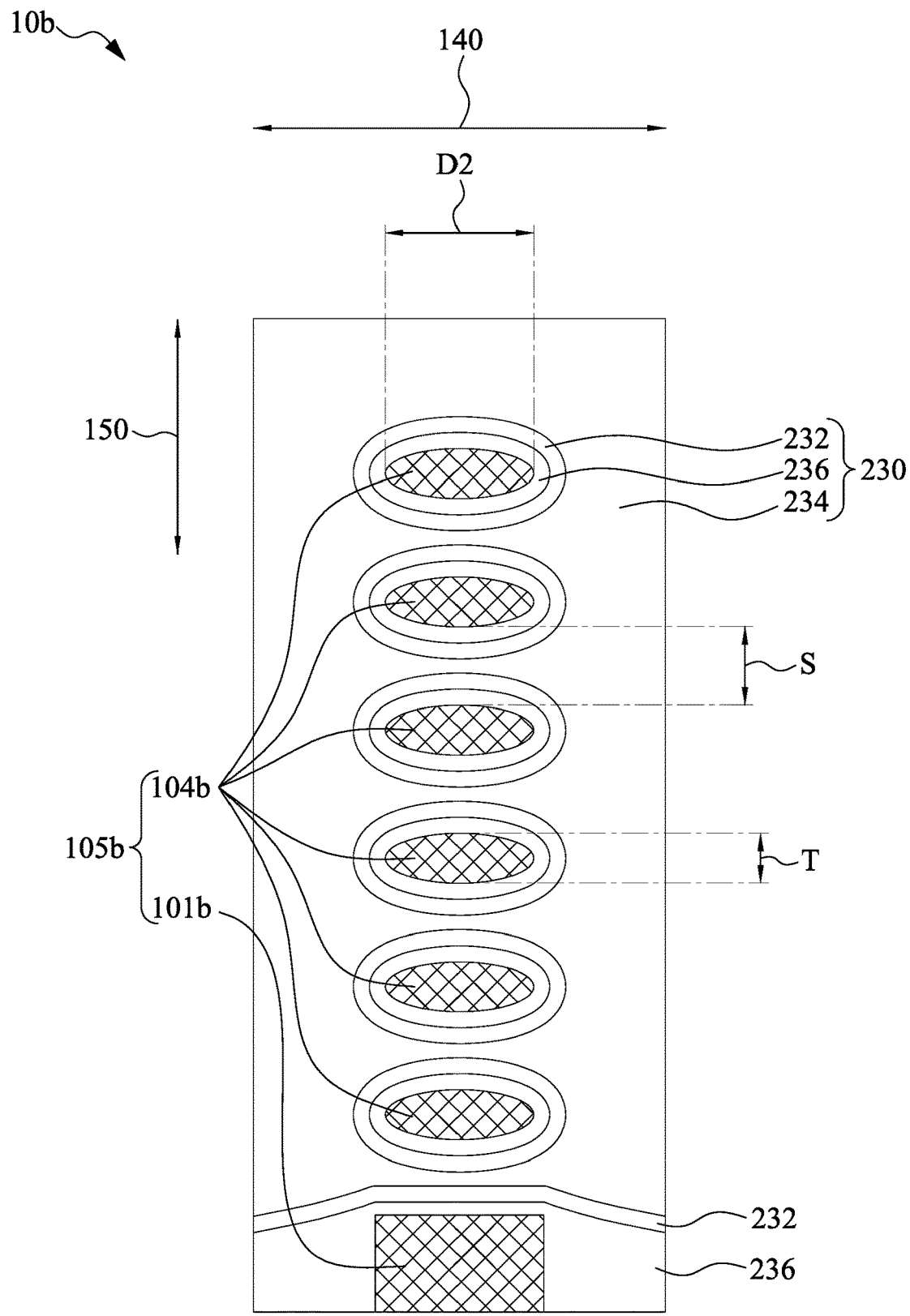
FIG. 13B is a cross-sectional view taken along a cross-sectional line of FIG. 12B.

FIGS. 1-8B and 10A-12B are perspective views of a method for manufacturing a semiconductor device at various stages in accordance with some embodiments of the present disclosure. FIG. 9 is a cross-sectional view taken along a cross-sectional line of FIG. 8A or FIG. 8B. FIG. 13A is a cross-sectional view taken along a cross-sectional line of FIG. 12A. FIG. 13B is a cross-sectional view taken along a cross-sectional line of FIG. 12B.

Figure 2A:
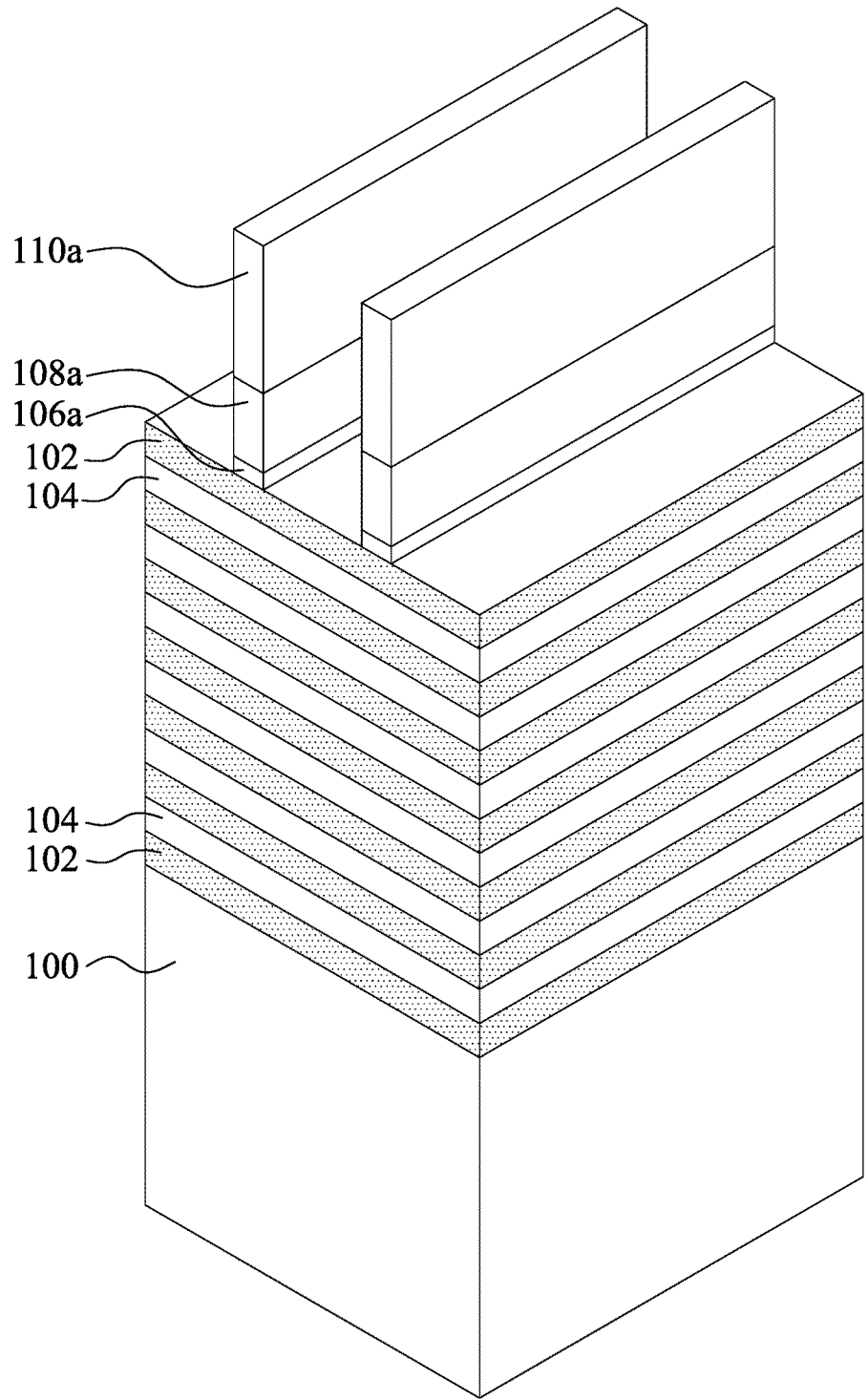
Figure 2B:
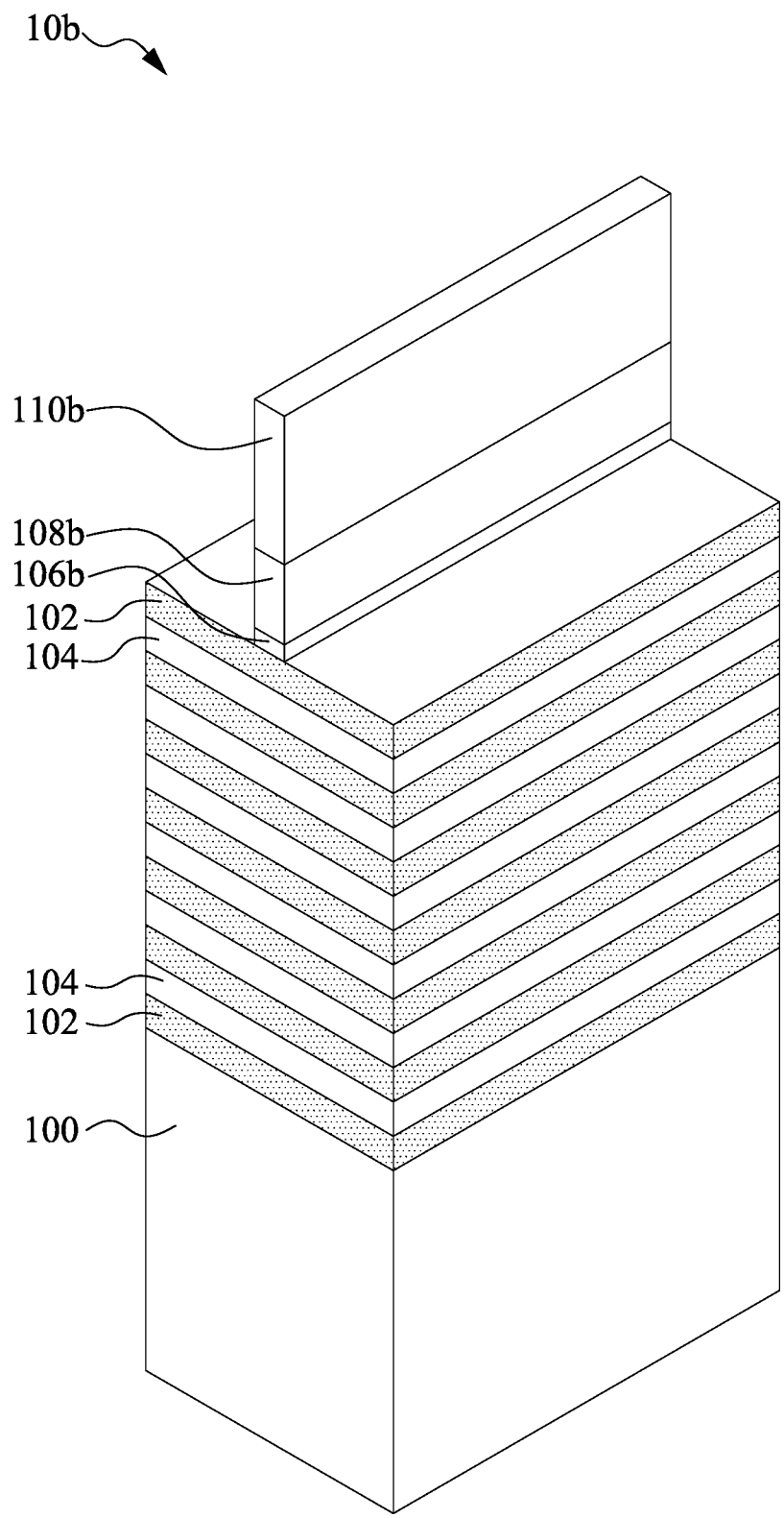

Reference is made to FIGS. 1, 2A and 2B. The semiconductor device 10 includes a substrate 100 and device features can be formed on, above or over the substrate 100. The fin activation area 10a is referred as a fin activation area with plural fins, e.g., in SRAM, random logic or input/output area, and the first fin activation area 10b is referred as a fin activation area with a single fin, e.g., stand cell.

The substrate 100 may be a bulk silicon substrate. Alternatively, the substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 100 also include a silicon-on-insulator (SOI) substrate. SOI substrates are fabricated using separation by implantation of oxygen (SIMOX), wafer bonding, and/or other suitable methods.

The doped regions may be doped with p-type dopants, such as boron or $BF_2$; n-type dopants, such as phosphorus or arsenic; or combinations thereof. The doped regions may be formed directly on the substrate 100, in a P-well structure, in an N-well structure, in a dual-well structure, and/or using a raised structure. The substrate 100 may further include various active regions, such as regions configured for an N-type metal-oxide-semiconductor transistor device and regions configured for a P-type metal-oxide-semiconductor transistor device.

A series of nano epitaxy layers 104 and sacrificial nano epitaxy layers 102 are alternately epitaxially grown on the substrate 100 for fin structure to form a nano epitaxy layer stack. In some embodiments, the nano epitaxy layer 104 may be nano epitaxy Silicon (Si) layer, and the present disclosure is not limited in this respect. In some embodiments, the sacrificial nano epitaxy layer 102 may be a nano epitaxy Silicon (Si)-Germanium (Ge) layer, and the present disclosure is not limited in this respect.

In some embodiments, the nano epitaxy layer 104 may have a thickness ranging from about 3 nm to about 7 nm, and the present disclosure is not limited in this respect. In some embodiments, the sacrificial nano epitaxy layer 102 may have a thickness ranging from about 2 nm to about 10 nm, and the present disclosure is not limited in this respect.

In some embodiments, a pad oxide layer 106, a pad nitride layer 108 and a mask layer 110 are deposited over the alternately-formed nano epitaxy layers 104 and sacrificial nano epitaxy layers 102. In some embodiments, the pad oxide layer 106 may be a thin film comprising silicon oxide formed, for example, using a thermal oxidation process. The pad oxide layer 106 may act as an adhesion layer between the nano epitaxy layers (102, 104) and the pad nitride layer 108. In some embodiments, the pad nitride layer 108 may be formed of silicon nitride, for example, using low-pressure chemical vapor deposition (LPCVD) or plasma enhanced chemical vapor deposition (PECVD). In some embodiments, the mask layer 110 may be formed of thick silicon oxide for example, using low-pressure chemical vapor deposition (LPCVD) or plasma enhanced chemical vapor deposition (PECVD). The mask layer 110 is used as a hard mask during following processes, such as photolithography.

Reference is made to FIGS. 2A and 2B again. The pad oxide layer 106, the pad nitride layer 108 and the mask layer 110 are patterned to form mask structures with uniform widths both in the fin activation area 10a and in the fin activation area 10b, e.g., each combination of the pad oxide layer 106a, the pad nitride layer 108a and the mask layer 110a in the fin activation area 10a has a uniform width that is substantially equal to that of the combination of the pad oxide layer 106b, the pad nitride layer 108b and the mask layer 110b in the fin activation area 10b.

Figure 3A:
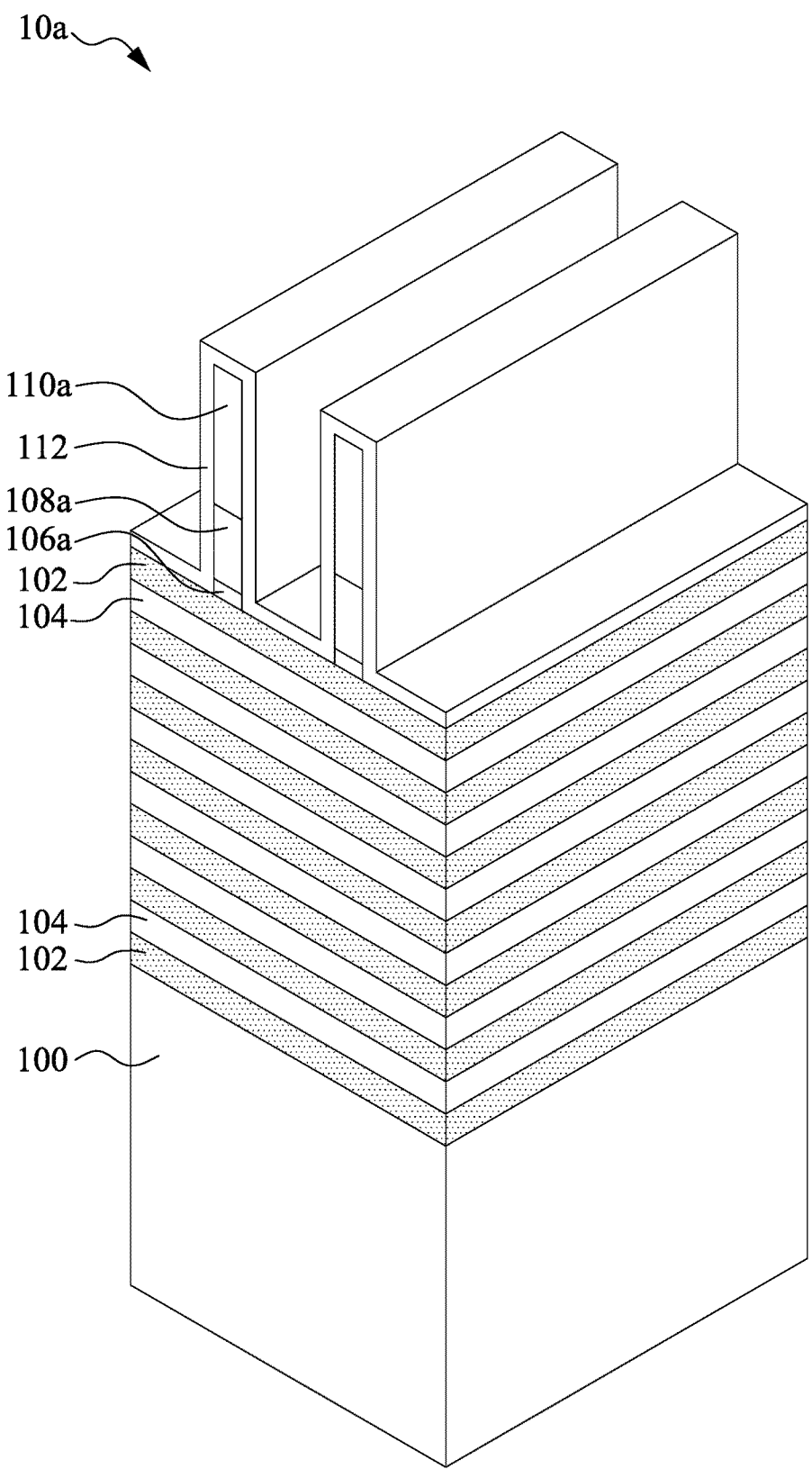
Figure 3B:
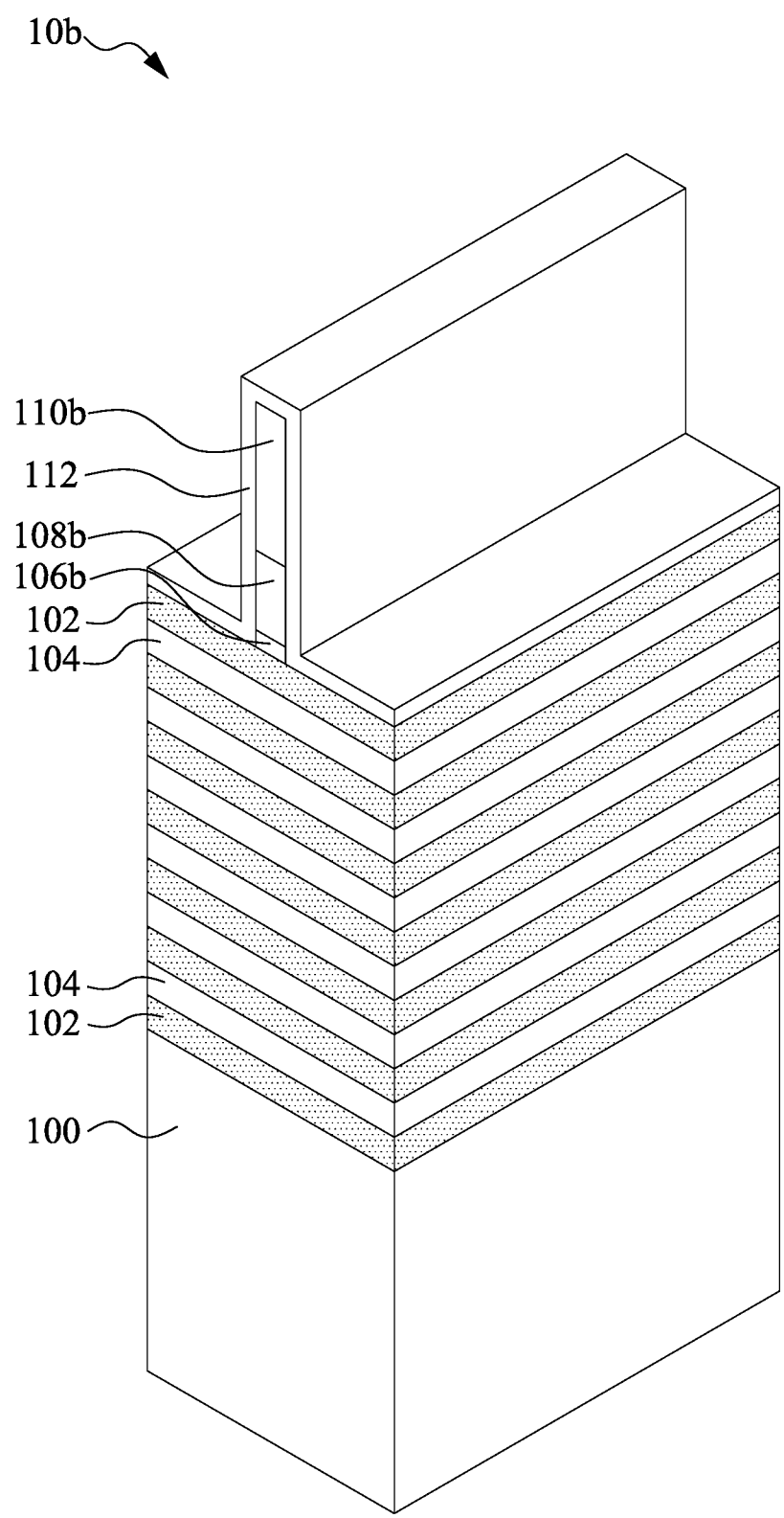

Reference is made to FIGS. 3A and 3B. A spacer cap layer 112 is conformally formed over the patterned pad oxide layer 106a, pad nitride layer 108a and mask layer 110a in the fin activation area 10a and over the patterned pad oxide layer 106b, pad nitride layer 108b and mask layer 110b in the fin activation area 10b.

In some embodiments, the spacer cap layer 112 may be formed of thin silicon oxide for example, using low-pressure chemical vapor deposition (LPCVD) or plasma enhanced chemical vapor deposition (PECVD).

Figure 4A:
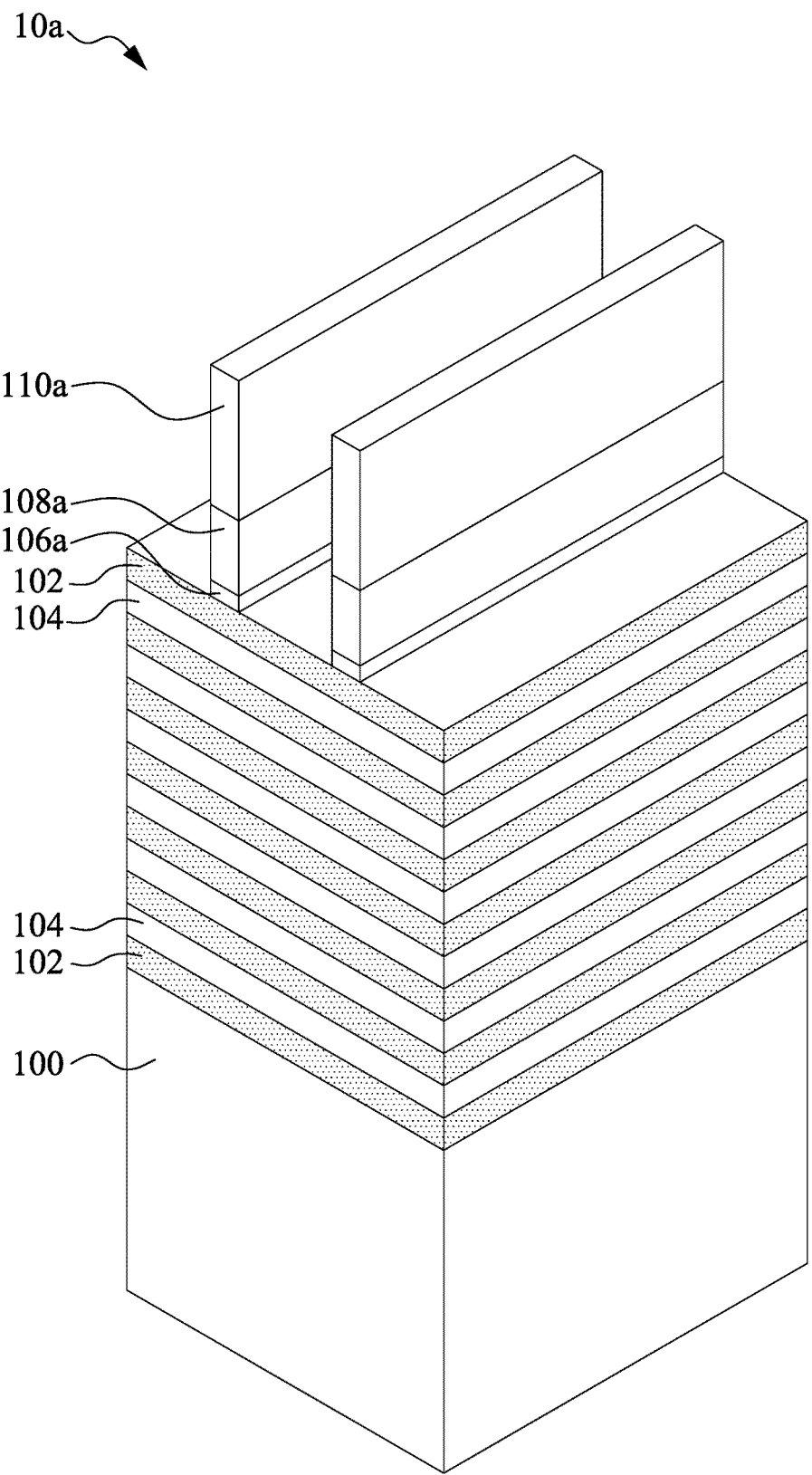
Figure 4B:
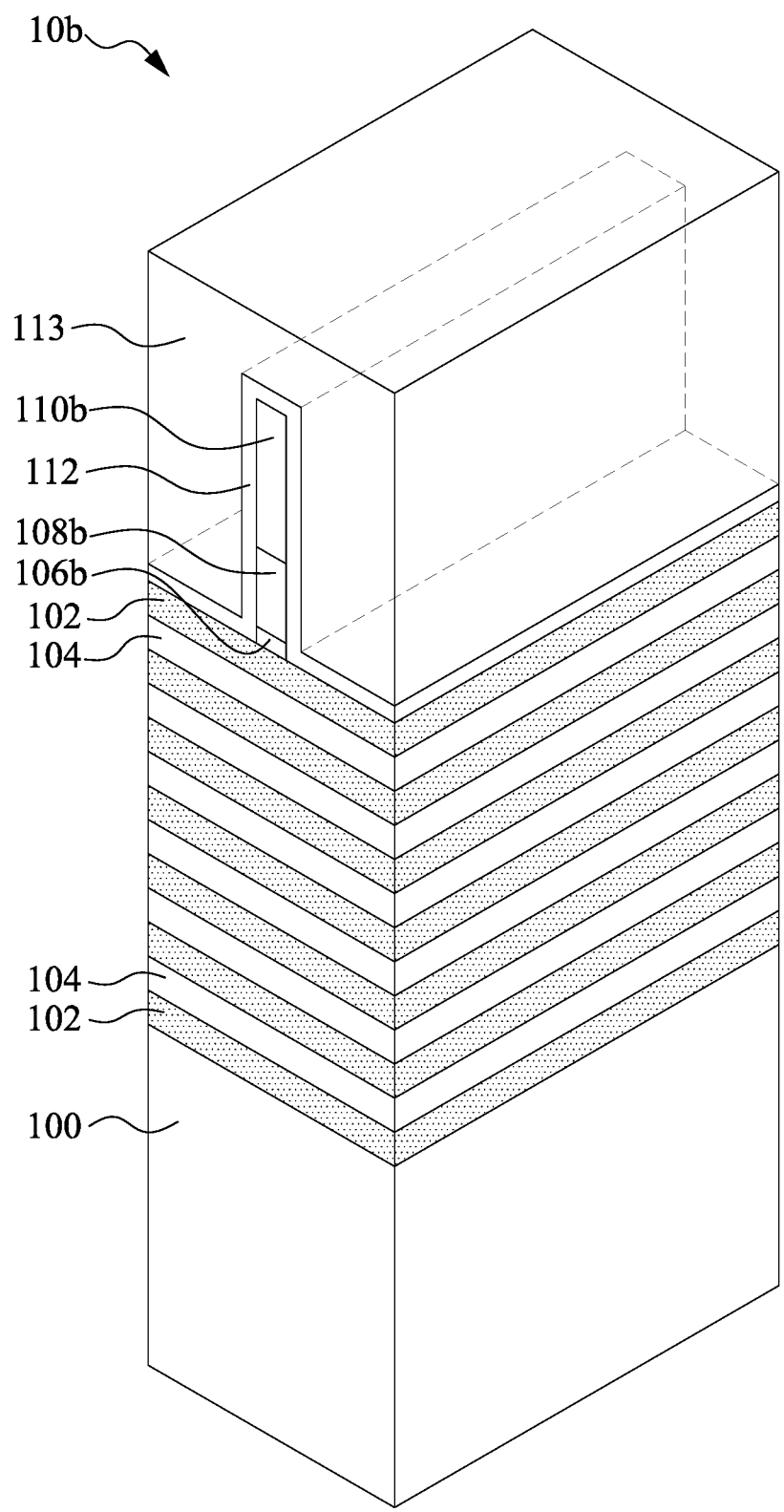

Reference is made to FIGS. 4A and 4B. A photo resist layer 113 is deposited over the fin activation area 10b as a mask structure and an etching process is performed both on the fin activation area 10a and in the fin activation area 10b. After the etching process, the spacer cap layer 112 in the fin activation area 10a is removed while the spacer cap layer 112 in the fin activation area 10b is protected by the photo resist layer 113 and not removed. In some embodiments, the photo resist layer 113 and the remained spacer cap layer 112 may have substantially the same width in the fin activation area 10b.

In some embodiments, the photo resist layer 113 may be removed before fin etching processes. In some embodiments, a portion of the remained spacer cap layer 112 in contact with the top sacrificial nano epitaxy layer 102 may be removed by a selective etching (i.e., etch the remained spacer cap layer 112 in the fin activation area 10b and not etch the top sacrificial nano epitaxy layer 102 in the fin activation area 10a) before fin etching processes such that the spacer cap layer 112 is remained merely upon sidewalls of the patterned pad oxide layer 106, pad nitride layer 108 and mask layer 110 as part of the mask structure when fin etching processes are performed.

Figure 5A:
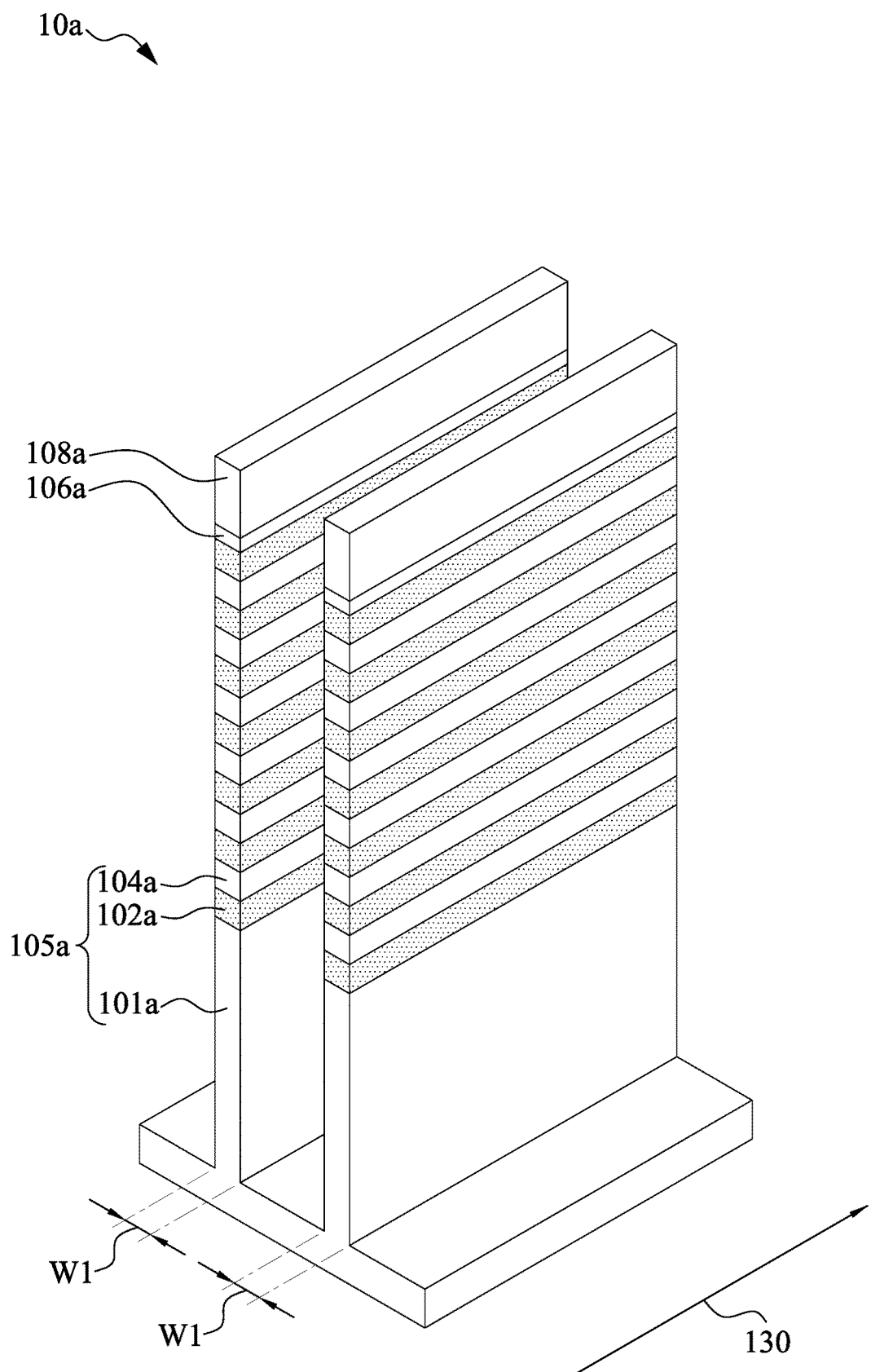
Figure 5B:
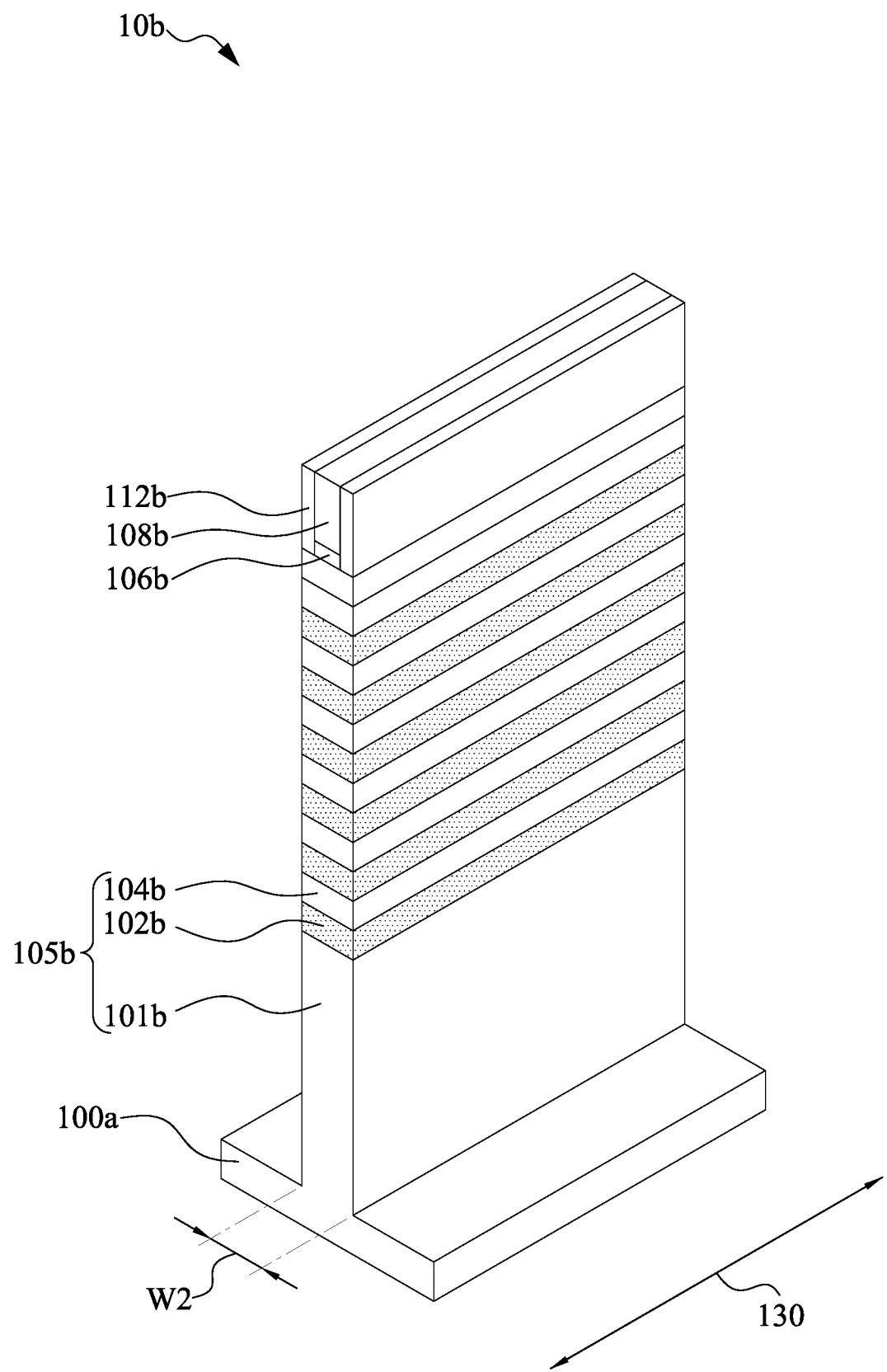

Reference is made to FIGS. 5A and 5B. One or more etching process(es) are performed to form multiple fin structures 105a in a lengthwise direction 130 in the fin activation area 10a and single fin structure 105b in a lengthwise direction 130 in the fin activation area 10b. Each fin structure 105a includes a base fin 101a protruding from the semiconductor substrate 100a and multiple patterned nano epitaxy layers 104a and sacrificial nano epitaxy layers 102a stacked above the base fin 101a. Each fin structure 105b includes a base fin 101b protruding from the semiconductor substrate 100a and multiple alternate nano epitaxy layers 104b and sacrificial nano epitaxy layers 102b stacked above the base fin 101b.

In some embodiments, the fin structures 105a may be etched by capping the patterned pad oxide layer 106, pad nitride layer 108 and mask layer 110 on top of the fin structures 105a in the fin activation area 10a. And, the fin structure 105b may be etched by capping the patterned pad oxide layer 106, pad nitride layer 108, and mask layer 110 as well as the remained spacer cap layer 112 on top of the fin structures 105b in the fin activation area 10b. The remained spacer cap layer 112 is located on used to broaden a width of the mask layer in order to obtain the relatively wide fin structure 105b during the fin patterning process.

After fin patterning process, the fin structures 105a are formed under the patterned pad oxide layer 106, pad nitride layer 108 and mask layer 110 in the fin activation area 10a while the fin structure 105b is formed under the patterned pad oxide layer 106, pad nitride layer 108, and mask layer 110 as well as the remained spacer cap layer 112 in the fin activation area 10b.

In some embodiments, the etching process may include dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Fin structures are formed over the substrate 100a within different functional regions, e.g., a LOGIC region and/or a memory region. In some embodiments, the fin structures may be of the same type or of different types. For example, some of the fin structures are n-type semiconductor fins, and the others of the fin structures are p-type semiconductor fins, and the present disclosure is not limited in this respect.

In some embodiments, each fin structure 105a in the fin activation area 10a is formed with a uniform width (W1) that is substantially equal to a uniform width (W1) of the other fin structure 105a in the fin activation area 10a. In some embodiments, the single fin structure 105b in the fin activation area 10b is formed with a uniform width (W2) that is greater than that (W1) of the fin structure 105a in the fin activation area 10a. The uniform width (W1) and width (W2) are measured in a direction that is perpendicular to the lengthwise direction 130.

Figure 6A:
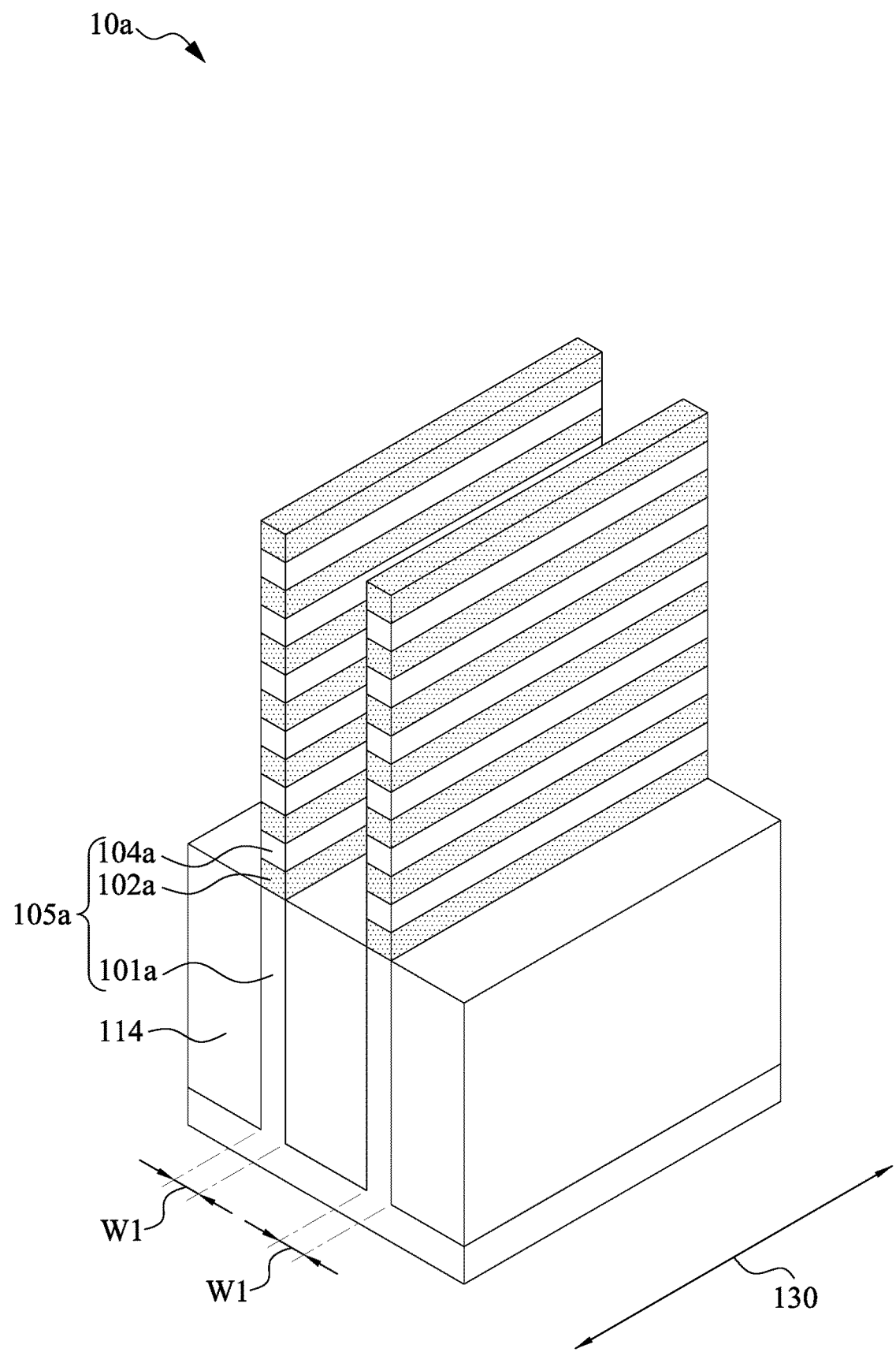
Figure 6B:
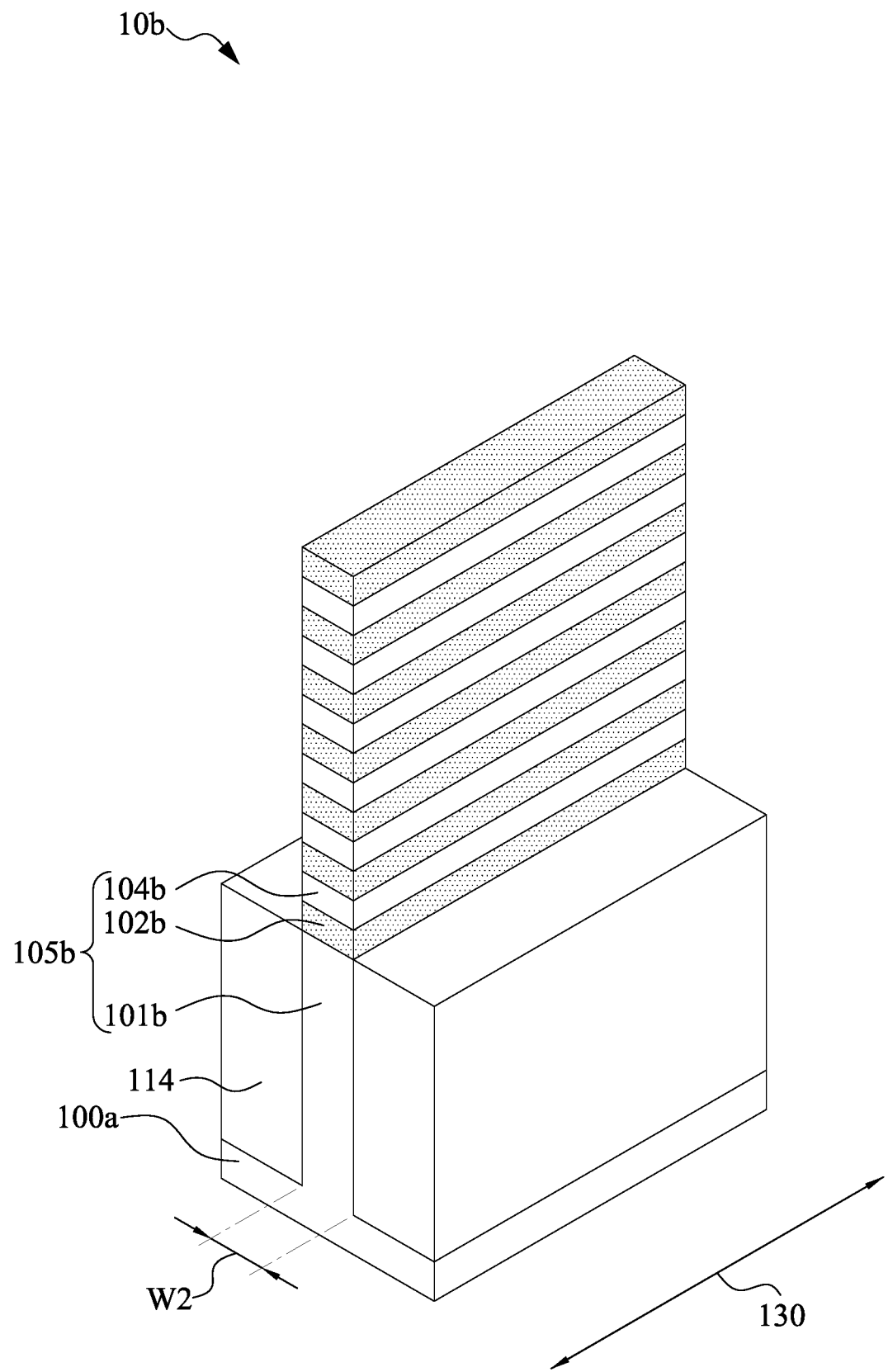

Reference is made to FIGS. 6A and 6B. One or more etching process(es) are performed to remove the pad oxide layer 106 and pad nitride layer 108 on the fin structure 105a in the fin activation area 10a and to remove the remained pad oxide layer 106b, pad nitride layer 108b and the spacer cap layer 112b on the fin structure 105b in the fin activation area 10b.

A field oxide layer 114 is formed to fill into trenches both in the fin activation area 10a and the fin activation area 10b to form a shallow trench isolation (STI). In some embodiments, at least the base fin 101a of each fin structure 105a is embedded within the field oxide layer 114 and at least the base fin 101b of each fin structure 105b is embedded within the field oxide layer 114.

In some embodiments, at least the multiple alternate nano epitaxy layers 104a and sacrificial nano epitaxy layers 102a of each fin structure 105a may be located above the STI (i.e., the field oxide layer 114) and at least the multiple alternate nano epitaxy layers 104b and sacrificial nano epitaxy layers 102b of each fin structure 105b may be located above the STI (i.e., the field oxide layer 114).

Figure 7A:
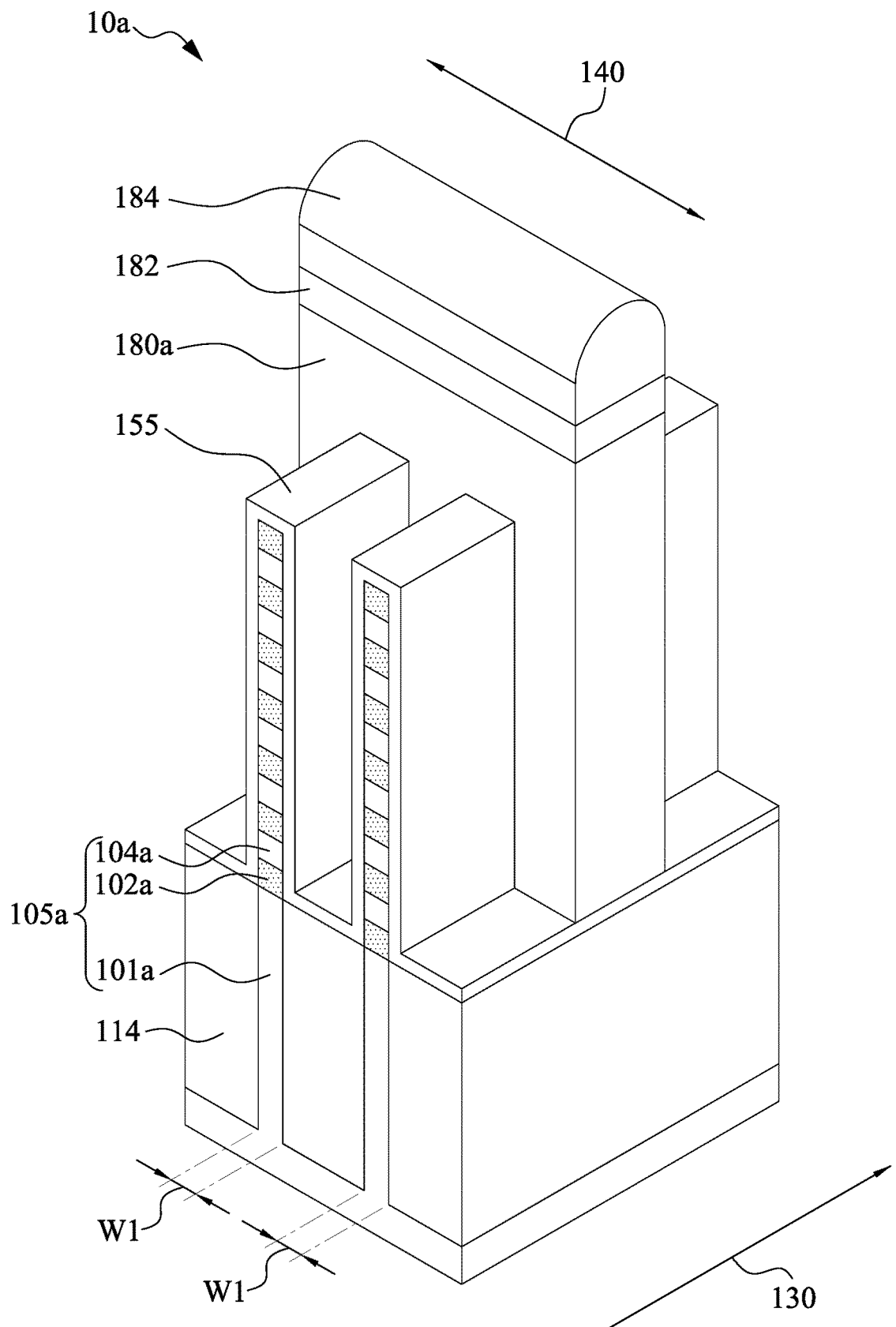
Figure 7B:
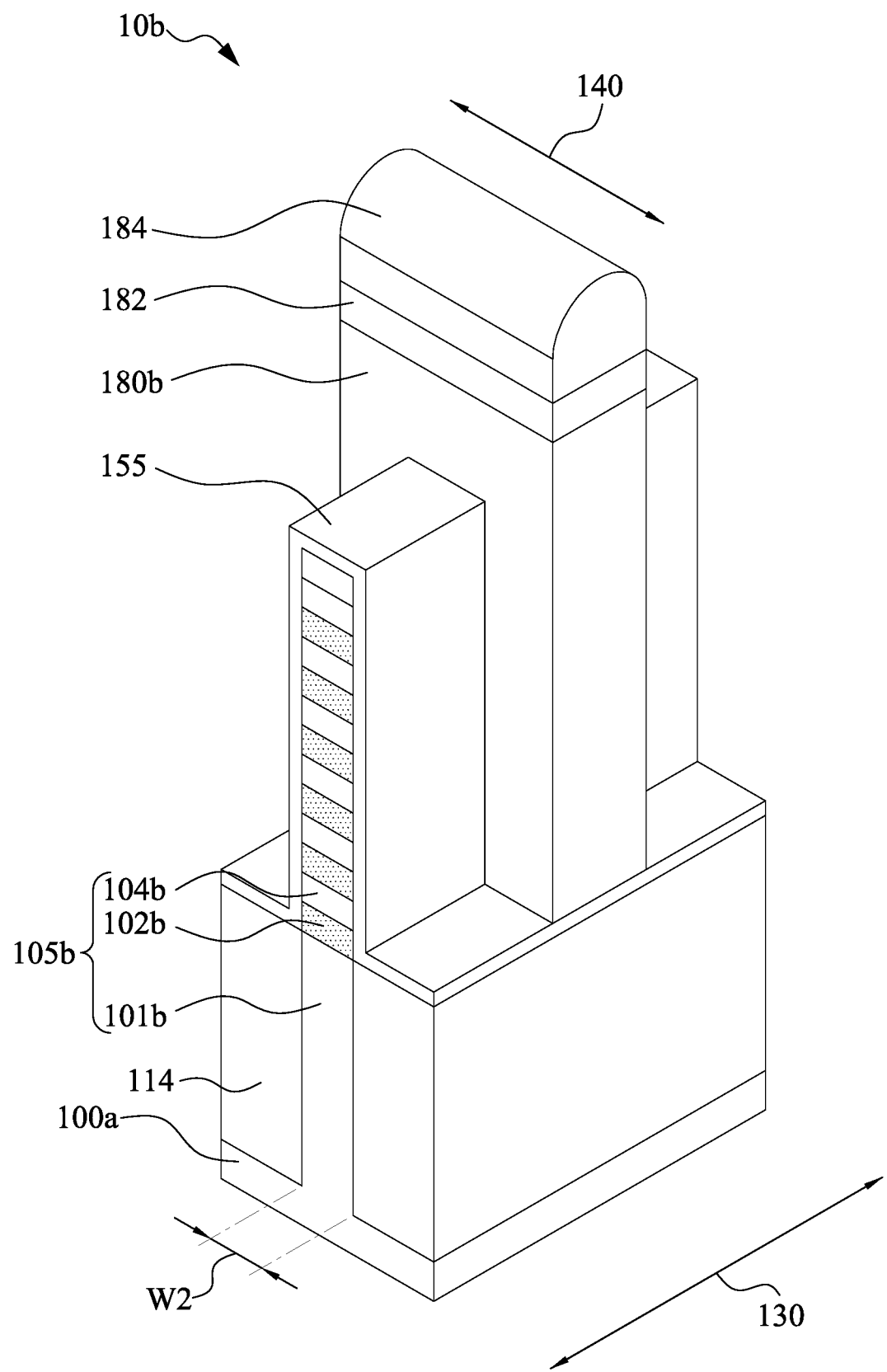

Reference is made to FIGS. 7A and 7B. A thin oxide layer 155 is formed over the STI (i.e., the field oxide layer 114) and the fin structures 105a and 105b. The oxide layer 155 may act as gate dielectric in later process. Plural dummy gates are formed over the oxide layer 155, in which the dummy gate 180a crosses the plural fin structures 105a in a direction 140, and the dummy gate 180b crosses the single fin structures 105b in a direction 140. In some embodiments, the direction 140 may be perpendicular to the lengthwise direction 130.

In some embodiments, mask layers 182 and 184 are formed over the dummy gates 180a and 180b. The mask layers 182 and 184 acts as a hard mask during the patterning process of the dummy gates 180a and 180b and may act as a hard mask during the following processes, such as etching. In some embodiments, the mask layers 182 and 184 may include silicon oxide, silicon nitride and/or silicon oxynitride.

In some embodiments, the dummy gates 180a and 180b may include polycrystalline-silicon (poly-Si) or poly-crystalline silicon-germanium (poly-SiGe). Further, the dummy gates may be doped poly-silicon with uniform or non-uniform doping. In some embodiments, the dummy gates 180a and 180b may be formed by, for example, forming a dummy gate material layer over the oxide layer 155. Patterned masks, such as mask layers 182 and 184, are formed over the dummy gate material layer. Then, the dummy gate material layer may be patterned using one or more etching processes, such as one or more dry plasma etching processes or one or more wet etching processes. During the etching process, the patterned mask may act as an etching mask. At least one parameter, such as etchant, etching temperature, etching solution concentration, etching pressure, source power, radio frequency (RF) bias voltage, etchant flow rate, of the patterning (or etching) recipe can be tuned. For example, dry etching process, such as plasma etching, may be used to etch the dummy gate material layer and the oxide layer 155 until the fin structures 105a and 105b are exposed.

Figure 8A:
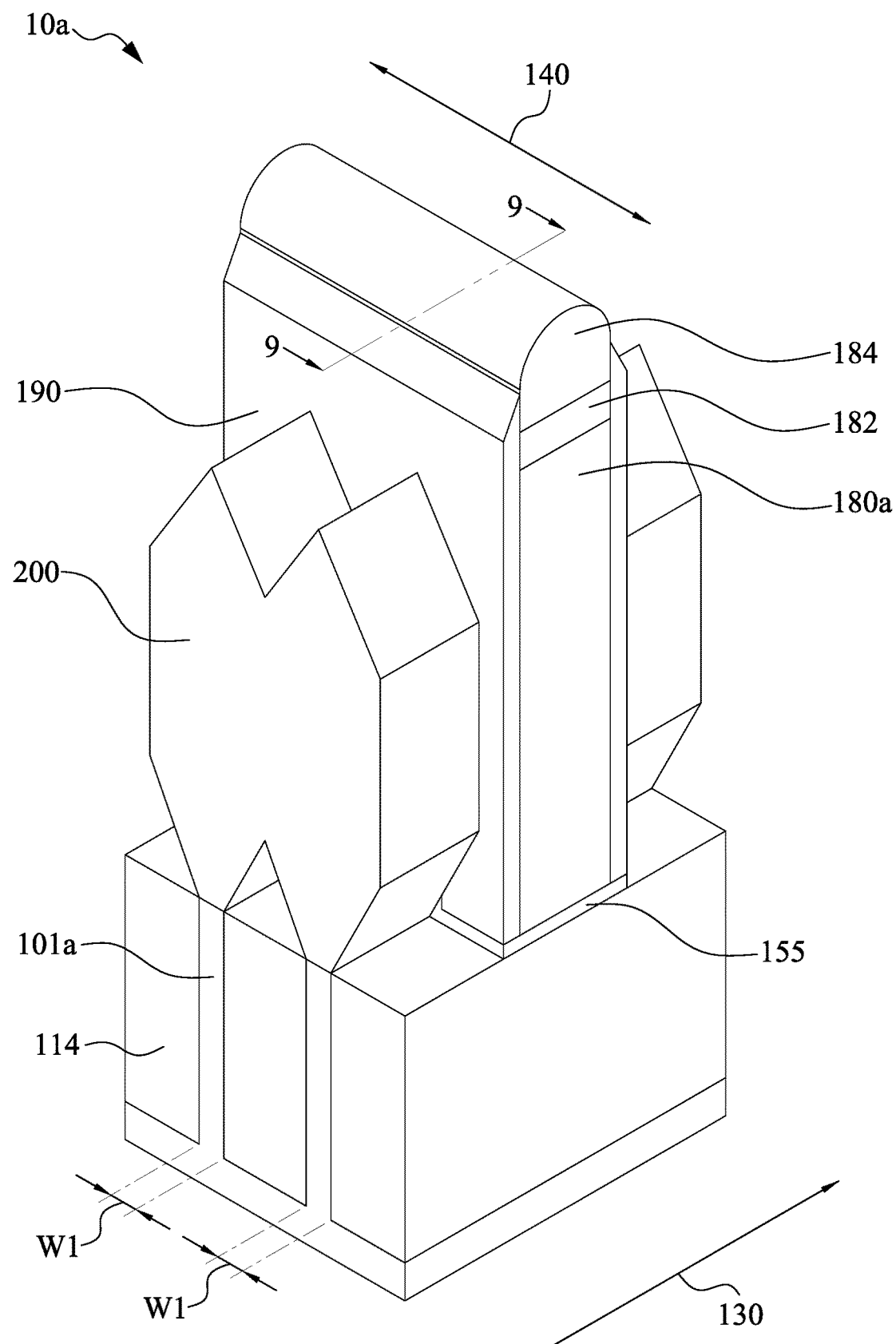
Figure 8B:
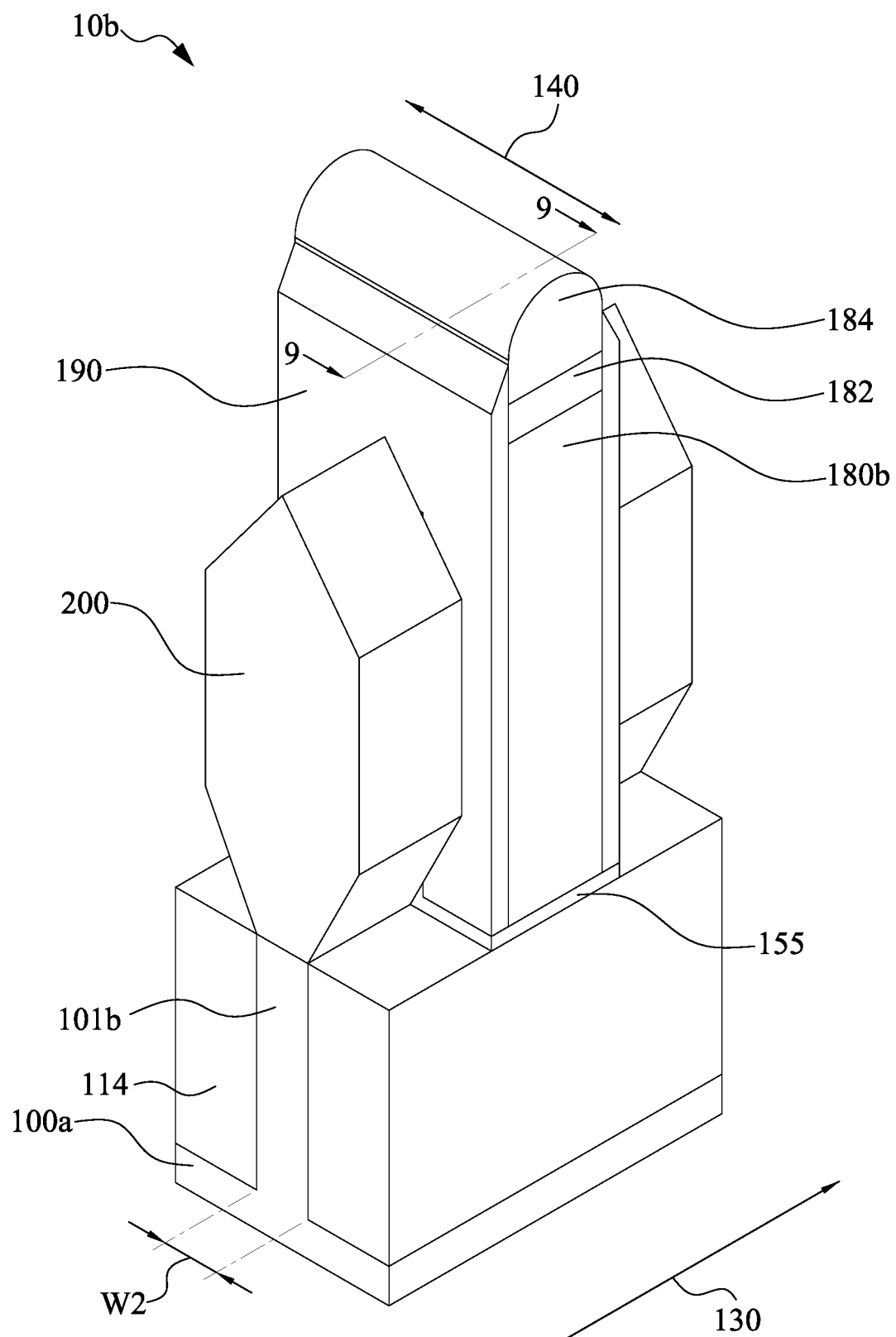
Figure 9:
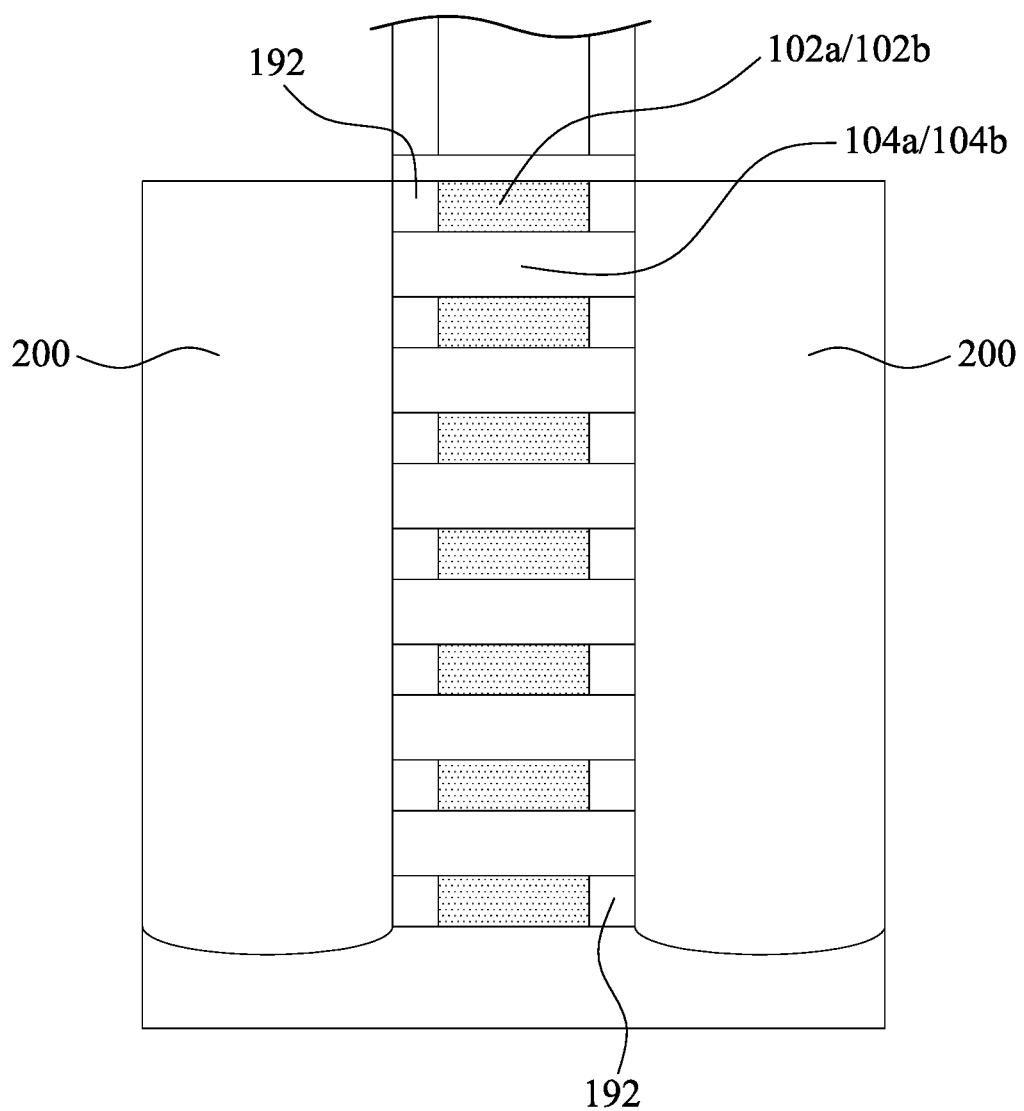
FIG. 9 is a cross-sectional view taken along a cross-sectional line of FIG. 8A or FIG. 8B.

Reference is made to FIGS. 8A and 8B. Gate spacer structures including plural gate spacers 190 on opposite sidewalls of the dummy gates 180a and 180b are formed. In some embodiments, at least one of the gate spacers 190 includes single or multiple layers. The gate spacers 190 can be formed by blanket depositing one or more dielectric layer(s) on the previously formed structure. The dielectric layer(s) may include silicon nitride (SiN), oxynitride, silicon carbon (SiC), silicon oxynitride (SiON), oxide, and the like. The gate spacers 190 may be formed by methods such as CVD, plasma enhanced CVD, sputter, or the like. The gate spacers 190 may then be patterned, such as by one or more etch processes to remove horizontal portions of the gate spacers 190 from the horizontal surfaces of the structure.

The oxide layer 155 exposed from the dummy gates 180a and 180b and the gate spacers 190 are removed by suitable process, such as etching. The remained portions of the oxide layer 155 are disposed under the dummy gates 180a and 180b and the gate spacers 190. Thus, the remained portions of the oxide layer 155 may be referred to as gate dielectric. Also, the dummy gate 180a and 180b and the remained oxide layer 155 may collectively be referred to as a dummy gate structure.

In some embodiments, the fin structures 105a exposed from the dummy gates 180a and the gate spacers 190 are removed by suitable process, such as etching, while the fin structures 105b exposed from the dummy gates 180b and the gate spacers 190 are removed by suitable process, such as etching.

Plural source/drain features 200 are respectively formed over the exposed base fins 101a and 101b of the substrate 100. In some embodiments, the wider source/drain features 200 are respectively formed over the exposed base fins 101a, in which each base fin 101a is equipped with a relatively narrow width, i.e., compared with the base fin 101b. In some embodiments, the thinner source/drain features 200 are respectively formed over the exposed base fin 101b that is equipped with a relatively large width, i.e., compared with the base fin 101a.

In some embodiments, the source/drain features 200 may be epitaxy structures, and may also be referred to as epitaxy features 200. The source/drain features 200 may be formed using one or more epitaxy or epitaxial (epi) processes, such that Si features, SiGe features, and/or other suitable features can be formed in a crystalline state on the semiconductor base fins 101a and 101b. In some embodiments, the source/drain features 200 may be cladding over the semiconductor base fins 101a and 101b.

In some embodiments, lattice constants of the source/drain features 200 are different from lattice constants of the semiconductor base fins 101a and 101b, such that channels in the semiconductor base fins 101a and 101b are strained or stressed to enable carrier mobility of the semiconductor device and enhance the device performance. In some embodiments, the source/drain features 200 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 110 (e.g., silicon).

The source/drain features 200 may be in-situ doped. The doping species include P-type dopants, such as boron or $BF_2$; N-type dopants, such as phosphorus or arsenic; and/or other suitable dopants including combinations thereof. If the source/drain features 200 are not in-situ doped, a second implantation process (i.e., a junction implant process) is performed to dope the source/drain features 200. One or more annealing processes may be performed to activate the source/drain features 200. The annealing processes include rapid thermal annealing (RTA) and/or laser annealing processes.

In some embodiments, the source/drain features 200 over the semiconductor base fins 101a and 101b may include the same doping-type, and the source/drain feature 200 over one of the semiconductor base fins 101a and 101b may include different doping-types. For example, some source/drain features 200 may be n-type, and the other source/drain features 200 may be p-type, and vise versa.

Reference is made to FIG. 9, which is a cross-sectional view taken along a cross-sectional line of FIG. 8A or FIG. 8B. In some embodiments, an inner spacer layer 192 is formed between the source/drain features 200 and the sacrificial nano epitaxy layers 102a/102b. The inner spacer layer 192 may be formed after removing the fin structures 105a exposed from the dummy gates 180a and the gate spacers 190. The inner spacer layer 192 may be formed of dielectric materials by methods such as CVD, plasma enhanced CVD, sputter, or the like. The nano epitaxy layers 104a/104b interconnects the source/drain features 200.

Figure 10A:
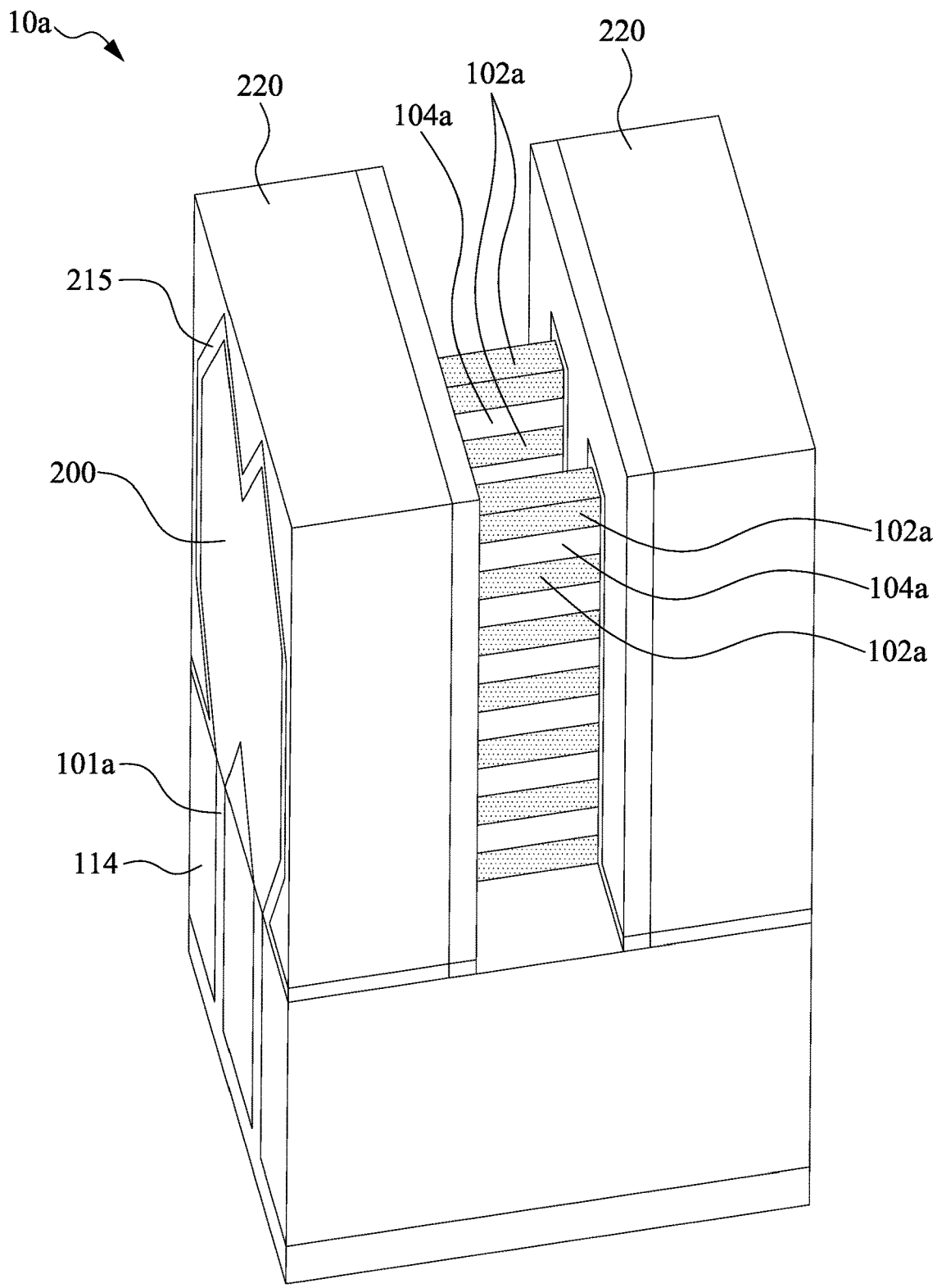
Figure 10B:
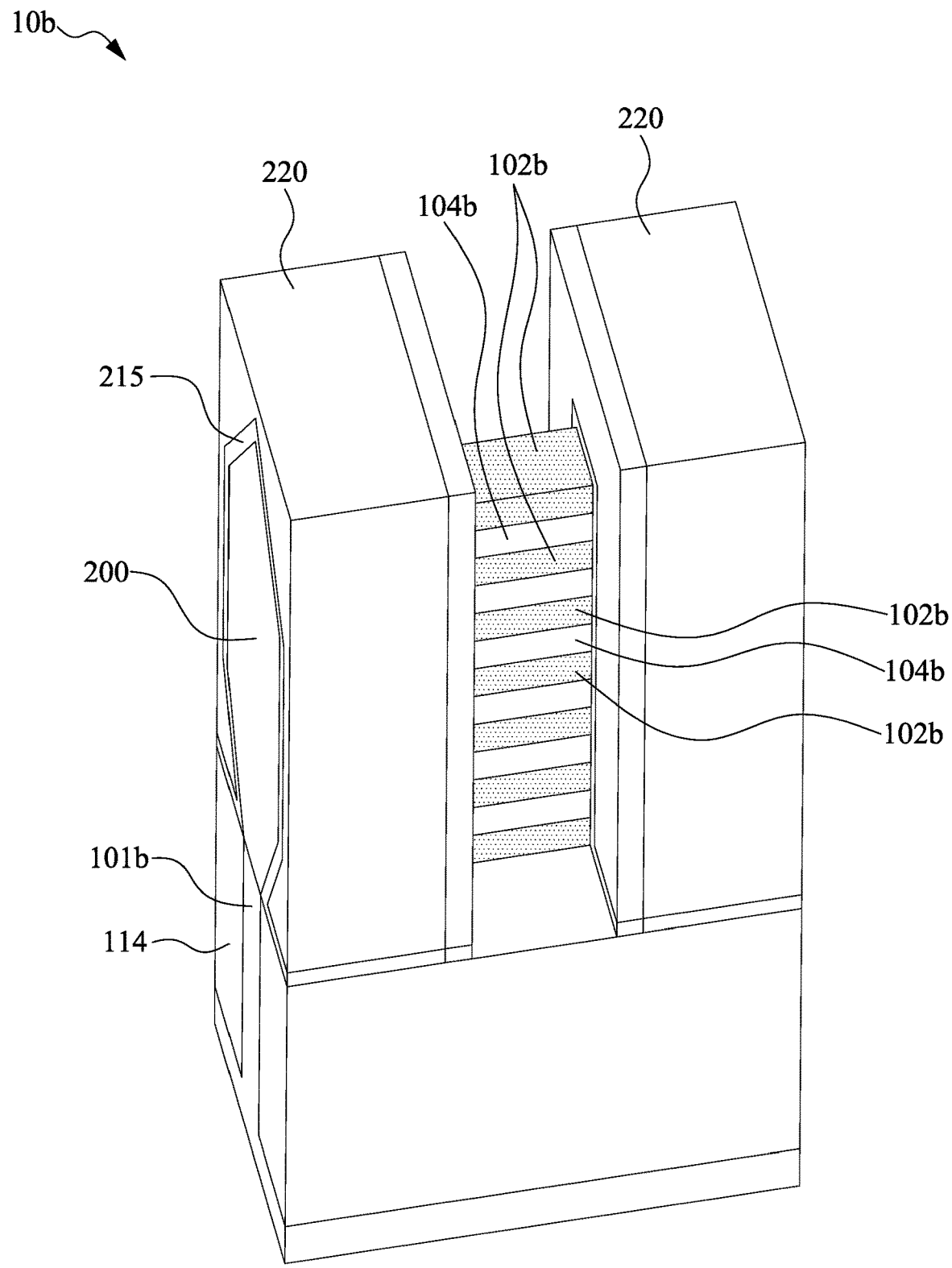

Reference is made to FIGS. 10A and 10B. An etching stop layer 215 and interlayer dielectric 220 is formed over the source/drain features 200. Then, a CMP process is performed to remove the excessive interlayer dielectric 220, and the mask layers 182 and 184 (referring to FIGS. 11A and 11B) until the dummy gates 180a and 180b are exposed.

In some embodiments, the interlayer dielectric 220 may include silicon nitride, silicon oxynitride, silicon oxycarbonitride, silicon carbide, silicon germanium, or combinations thereof. The interlayer dielectric 220 may be formed by a suitable technique, such as CVD, ALD and spin-on coating. In some embodiments, air gaps may be created in the interlayer dielectric 220.

Then, a replacement gate (RPG) process scheme is employed. The dummy gates 180a and 180b are replaced with metal gates. For example, the dummy gates 180a and 180b are removed to from a plurality of gate trenches and expose the multiple alternate nano epitaxy layers and sacrificial nano epitaxy layers. The dummy gate gates 180a and 180b are removed by a selective etch process, including a selective wet etch or a selective dry etch, and carries a substantially vertical profile of the gate spacers 190.

Figure 11A:
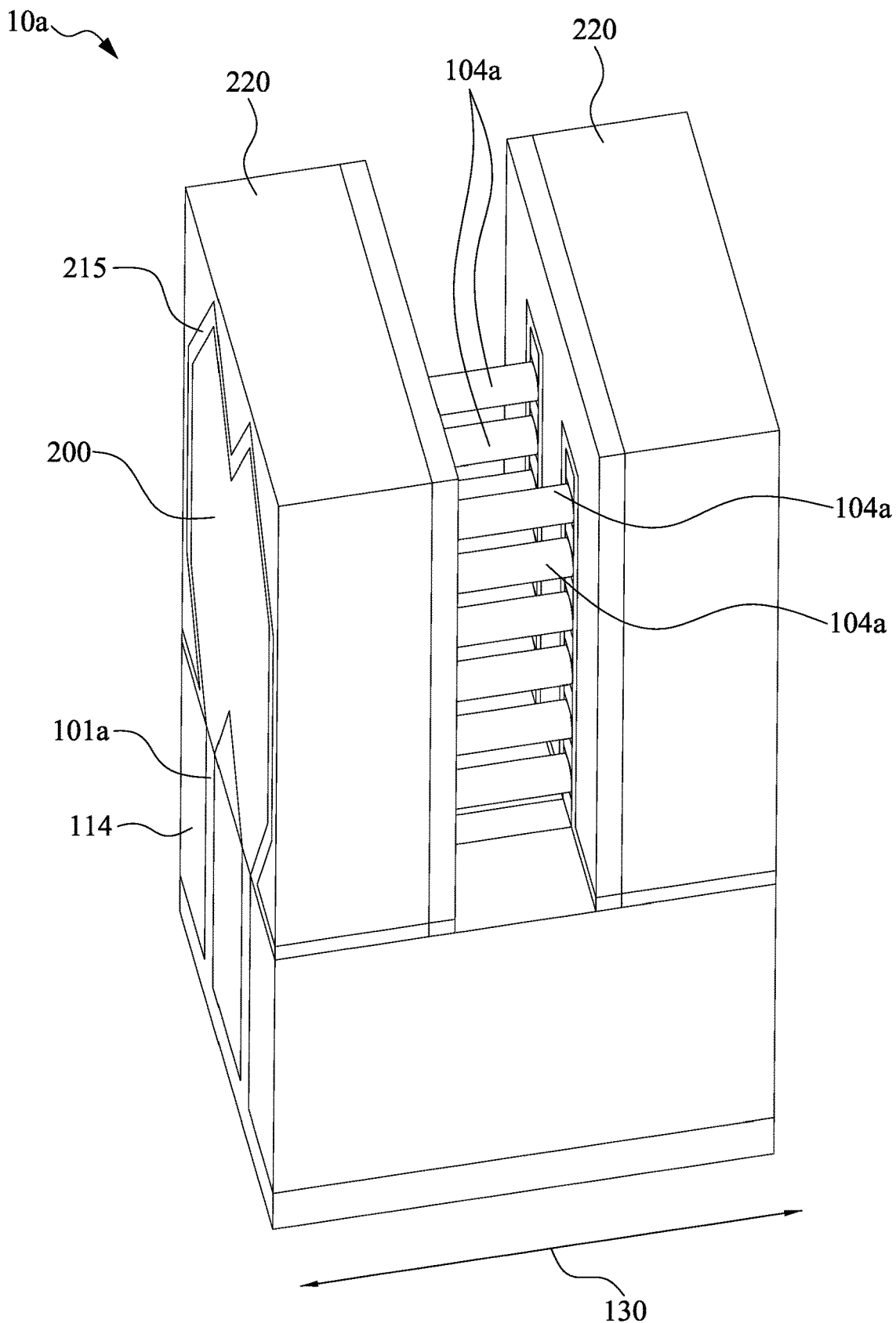
Figure 11B:
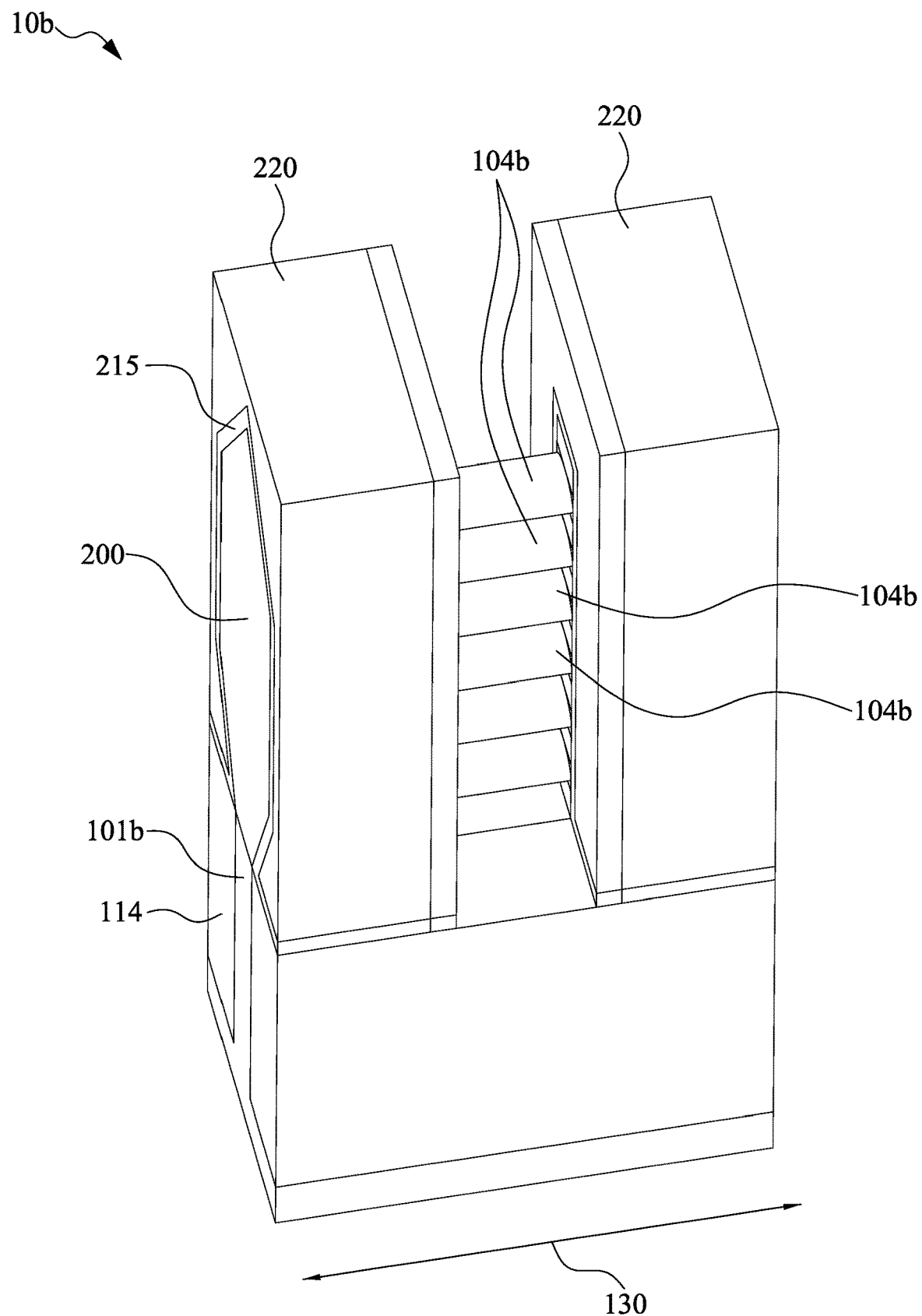

Reference is made to FIGS. 11A and 11B. The sacrificial nano epitaxy layers 102a/102b are removed by a selective etch process, including a selective wet etch or a selective dry etch, and the remained nano epitaxy layers 104a/104b forms nano sheet fins or nano wire fins that are spaced from each other. That is, the nano epitaxy layers 104a/104b may be referred as nano sheet or nano wire 104a/104b.

Reference is made to FIGS. 12A to 13B. FIG. 13A is a cross-sectional view taken along a cross-sectional line of FIG. 12A. FIG. 13B is a cross-sectional view taken along a cross-sectional line of FIG. 12B. The gate structures 230 are formed respectively in the gate trenches to surround or wrap around the nano sheet fins or nano wire 104a/104b simultaneously.

The gate structures 230 include an interfacial layer 236, gate dielectrics 232 formed over the interfacial layer 236, and gate metals 234 formed over the gate dielectrics 232. The gate dielectrics 232, as used and described herein, include dielectric materials having a high dielectric constant, for example, greater than that of thermal silicon oxide (~3.9). The gate metals 234 may include a metal, metal alloy, and/or metal silicide.

In some embodiments, the gate structures 230 extend in a direction 140 crossing the direction 130 in which the nano sheet fins or nano wire 104a/104b extend. The direction 140 may be perpendicular to the direction 130. The gate structures 230 fill into the gate trenches to surround or wrap the nano sheet fins or nano wire 104a/104b respectively.

Reference is made to FIGS. 13A to 13B. In some embodiments, a quantity of the nano wires 104a of each fin structure 105a is equal to that of the nano wires 104b of the fin structure 105b. Each fin structure 105a includes a base fin 101a and plural nano wires 104a located vertically aligned with the base fin 101a. The nano wires 104a are spaced from the base fin 101a and from each other. Each fin structure 105b includes a base fin 101b and plural nano wires 104b located vertically aligned with the base fin 101a. The nano wires 104b are spaced from the base fin 101b and from each other.

In some embodiments, the nano wires 104a of at least one fin structure 105a have a uniform thickness (T) that is substantially equal to a uniform thickness (T) of the nano wires 104b of at least one fin structure 105b. The thickness (T) of the nano wires 104a or 104b is measured in a direction 150 that is perpendicular to the direction 140.

In some embodiments, a uniform pitch (S) between adjacent nano wires 104a of at least one fin structure 105a is substantially equal to a uniform pitch (S) between adjacent nano wires 104b of at least one fin structure 105b. The uniform pitch (S) of the fin structures 105a/105b is measured in a direction 150 that is perpendicular to the direction 140.

In some embodiments, the nano wires 104a of at least one fin structure 105a have a uniform width (D1) that is smaller than a uniform width (D2) of the nano wires 104b of at least one fin structure 105b. The widths (D1 or D2) of the nano wires 104a or 104b are measured in the direction 140.

In some embodiments, the nano wires 104a of at least one fin structure 105a have a uniform width (D1) ranging from about 3 nm to about 7 nm. In some embodiments, the nano wires 104b of at least one fin structure 105b have a uniform width (D2) ranging from about 8 nm to about 16 nm. In some embodiments, the width (D2) of the nano wire 104b may be two times greater than the width (D1) of the nano wire 104a, but may not be greater than three times the width (D1) of the nano wire 104a because the gate structure may not have enough width to warp around the nano wire 104b with such width.

In some embodiments, the uniform pitch (S) between adjacent nano wires 104a or between adjacent nano wires 104b ranges from about 2 nm to about 10 nm. In some embodiments, the uniform thickness (T) of each nano wire 104a or each nano wire 104b ranges from about 3 nm to about 7 nm.

In some embodiments, a quantity of the nano wires 104a of each fin structure 105a is from 2 to 10 and a quantity of the nano wires 104b of each fin structure 105b is from 2 to 10.

In some embodiments, each nano wire 104a or 104a is wrapped by the interfacial layer 236, the gate dielectric 232 and the gate metal 234.

In some embodiments, the gate metals 234 included in the gate structures 230 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide. For example, the gate metals 234 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electro-plating and/or other suitable process.

In some embodiments, the interfacial layer 236 may include a dielectric material such as silicon oxide ($SiO_2$), HfSiO, and/or silicon oxynitride (SiON). The interfacial layer 236 may be formed by chemical oxidation, thermal oxidation, ALD, CVD, and/or other suitable method. The gate dielectrics 232 may include a high-K dielectric layer such as hafnium oxide ($HfO_2$). Alternatively, the gate dielectric 212 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectrics 232 may be formed by ALD, PVD, CVD, oxidation, and/or other suitable methods.

According to aforementioned embodiments, a semiconductor device includes a first fin structure and a second fin structure located over a substrate. The first fin structure has a single stack of first nano wires or sheets with larger width or diameter and the second fin structure has multiple stacks of second nano wires or sheets with smaller width or diameter for design flexibility. Because the first and second fin structures are concurrently formed, the single stack of first nano wires or sheets and multiple stacks of second nano wires or sheets all have equal sheet numbers and substantially the same pitch and thickness. With such configuration, the single stack of first nano wires or sheets with larger width or diameter may obtain speed gain and the multiple stacks of second nano wires or sheets need smaller width or diameter to aggress fin pitch shrinkage for even scaled down process.

An embodiment of the present disclosure is a semiconductor device having a semiconductor substrate, a first fin structure and a second fin structure. The first fin structure includes a first fin and at least two first nano wires located above the first fin, and the first fin protrudes from the semiconductor substrate. The second fin structure includes a second fin and at least two second nano wires located above the second fin, and the second fin protrudes from the semiconductor substrate. Each first nano wire has a first width different from a second width of each second nano wire.

An embodiment of the present disclosure is that each first nano wire has a first thickness substantially equal to a second thickness of each second nano wire.

An embodiment of the present disclosure is that a quantity of the first nano wires is equal to that of the second nano wires.

An embodiment of the present disclosure is that a first pitch between immediately-adjacent two of the first nano wires is substantially equal to a second pitch between immediately-adjacent two of the second nano wires.

An embodiment of the present disclosure is that the first and second fins and the at least two first and second nano wires are arranged in a first direction, and the first and second widths are measured in a second direction that is perpendicular to the first direction.

An embodiment of the present disclosure is the semiconductor device further including a first gate structure extending in a third direction crossing the first direction and surrounding the at least two first nano wires.

An embodiment of the present disclosure is the semiconductor device further including a second gate structure extending in a third direction crossing the first direction and surrounding the at least two second nano wires.

An embodiment of the present disclosure is the semiconductor device further including a pair of first epitaxy structures, and the at least two first nano wires interconnect the pair of first epitaxy structures.

An embodiment of the present disclosure is the semiconductor device further including a pair of second epitaxy structures, and the at least two second nano wires interconnect the pair of second epitaxy structures.

An embodiment of the present disclosure is that the at least two first nano wires are spaced from the first fin, and the at least two second nano wires are spaced from the second fin.

An embodiment of the present disclosure is a semiconductor device having semiconductor substrate, a first fin structure, a plurality of second fin structures, a first gate structure and a second gate structure. The first fin structure includes a first fin and at least two first nano wires arranged in a first direction, and the first fin protrudes from the semiconductor substrate. Each second fin structure includes a second fin and at least two second nano wires arranged in the first direction, and the second fin protrudes from the semiconductor substrate. The first gate structure extends in a second direction crossing the first direction and surrounding the at least two first nano wires of the first fin structure. The second gate structure extends in the second direction crossing the first direction and surrounding the second nano wires of the second fin structures. Each first nano wire has a first width greater than a second width of each second nano wire.

An embodiment of the present disclosure is that the at least two first nano wires have a uniform first thickness.

An embodiment of the present disclosure is that the at least two second nano wires have a uniform second thickness that is substantially equal to the uniform first thickness.

An embodiment of the present disclosure is that the first and second widths are measured in the second direction.

An embodiment of the present disclosure is that a first pitch between any immediately-adjacent two of the first nano wires is uniform.

An embodiment of the present disclosure is that a second pitch between any immediately-adjacent two of the second nano wires is uniform and is substantially equal to the first pitch.

An embodiment of the present disclosure is that the at least two first nano wires are spaced from each other, and the at least two second nano wires are spaced from each other.

An embodiment of the present disclosure is a method for manufacturing a semiconductor device including epitaxially growing a sacrificial layer over a substrate; epitaxially growing a semiconductor layer over the sacrificial layer; depositing a mask layer over the semiconductor layer; patterning the mask layer to form a first mask structure and a second mask structure over the semiconductor layer; forming a spacer cap layer over the first mask structure and the second mask structure; etching the spacer cap layer over the first mask structure, wherein the etched spacer cap layer remains on a sidewall of the second mask structure; etching the semiconductor layer and the sacrificial layer exposed by the first mask structure, the second mask structure, and the etched spacer cap layer to form a first fin under the first mask structure and a second fin under the second mask structure and the etched spacer cap layer, wherein the second fin is wider than the first fin; etching the sacrificial layer in the first fin and the second fin; and forming a first gate structure wrapping around the semiconductor layer in the first fin and forming a second gate structure wrapping around the semiconductor layer in the second fin.

An embodiment of the present disclosure is the method further including patterning the mask layer is performed such that a third mask structure is formed over the semiconductor layer and adjacent the first mask structure, wherein the first and third mask structures have substantially the same width.

An embodiment of the present disclosure is the method further including forming the first gate structure and forming the second gate structure are performed simultaneously.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a semiconductor substrate;
a first fin structure comprising a first fin and at least two first nano wires disposed above the first fin, wherein the first fin protrudes from the semiconductor substrate; and
a second fin structure comprising a second fin and at least two second nano wires disposed above the second fin, wherein the second fin protrudes from the semiconductor substrate;
a first gate structure surrounding the at least two first nano wires, wherein the first gate structure has a curve bottom surface,
wherein each first nano wire has a first width different from a second width of each second nano wire, and the each first nano wire has a first thickness substantially equal to a second thickness of the each second nano wire.

2. The semiconductor device of claim 1, wherein a quantity of the first nano wires is equal to that of the second nano wires.

3. The semiconductor device of claim 1, wherein a first pitch between immediately-adjacent two of the first nano wires is substantially equal to a second pitch between immediately-adjacent two of the second nano wires.

4. The semiconductor device of claim 1, wherein the first and second fins and the at least two first and second nano wires are disposed in a first direction, and the first and second widths are measured in a second direction that is perpendicular to the first direction.

5. The semiconductor device of claim 4, further comprising a second gate structure extending in a third direction crossing the first direction and surrounding the at least two second nano wires.

6. The semiconductor device of claim 1, further comprising a pair of first epitaxy structures, and the at least two first nano wires interconnect the pair of first epitaxy structures.

7. The semiconductor device of claim 1, further comprising a pair of second epitaxy structures, and the at least two second nano wires interconnect the pair of second epitaxy structures.

8. The semiconductor device of claim 1, wherein the at least two first nano wires are spaced from the first fin, and the at least two second nano wires are spaced from the second fin.

9. The semiconductor device of claim 1, further comprising:
a third fin structure comprising a third fin and at least two third nano wires disposed above the third fin, wherein the third fin protrudes from the semiconductor substrate,
wherein the third nanowires are surrounded by the first gate structure.

10. The semiconductor device of claim 1, wherein the first gate structure comprises a gate dielectric layer, and a portion of the gate dielectric layer is lower than a top surface of the first fin.

11. A semiconductor device comprising:
a semiconductor substrate;
a first fin structure comprising a first fin and at least two first nano wires disposed in a first direction, wherein the first fin protrudes from the semiconductor substrate;
a first gate structure extending in a second direction crossing the first direction and surrounding the at least two first nano wires of the first fin structure;
a plurality of second fin structures, each second fin structure comprises a second fin and at least two second nano wires disposed in the first direction, wherein the second fin protrudes from the semiconductor substrate; and
a second gate structure extending in the second direction crossing the first direction and surrounding the second nano wires of the second fin structures;
a third fin structure comprising a third fin and at least two third nano wires disposed in the first direction, wherein the third fin protrudes from the semiconductor substrate, and the first gate structure surrounds the at least two third nano wires of the third fin structure, and the first gate structure has a curve bottom portion between the first fin and the third fin,
wherein each first nano wire has a first width greater than a second width of each second nano wire, and the first nano wires and the second nano wires have a substantially same thickness.

12. The semiconductor device of claim 11, wherein the first and second widths are measured in the second direction.

13. The semiconductor device of claim 11, wherein a first pitch between any immediately-adjacent two of the first nano wires is uniform.

14. The semiconductor device of claim 13, wherein a second pitch between any immediately-adjacent two of the second nano wires is uniform and is substantially equal to the first pitch.

15. The semiconductor device of claim 11, wherein the at least two first nano wires are spaced from each other, and the at least two second nano wires are spaced from each other.

16. The semiconductor device of claim 11, further comprising:
- a first source/drain feature over the first fin and the third fin; and
- a second source/drain feature over the first fin,
- wherein a first portion of the first source/drain feature over the first fin is higher than a middle portion of the first source/drain feature located between the first fin and the second fin.

17. A semiconductor device comprising:
- a substrate;
- a first fin, a second fin, and a third fin formed over the substrate;
- a first nano wire formed over the first fin, a second nano wire formed over the second fin, and a third nano wire formed over the third fin;
- a first gate structure formed around the first nano wire; and
- a second gate structure formed around the second nanowire,
- wherein a bottom of the first nano wire is substantially level with a bottom of the second nano wire, and a top of the first nano wire is substantially level with a top of the second nano wire, and the second nano wire is wider than the first nano wire, and
- wherein the third nano wire is surrounded by the first gate structure, and a width of the third nano wire is substantially equal to a width of the first nano wire, and the first gate structure has a curve bottom portion between the first fin and the third fin.

18. The semiconductor device of claim 17, further comprising:
- first interfacial layers formed around the first nano wire and covering a top surface of the first fin.

19. The semiconductor device of claim 17, wherein a bottom of the curve bottom portion of the first gate structure is lower than a top surface of the first fin.

20. The semiconductor device of claim 17, wherein
- a first source/drain feature connecting to the first nano wire and the third nano wire, wherein the first source/drain feature laterally extends from the first fin to the third fin and has a recessed portion between the first fin and the third fin.

* * * * *